United States Patent
Ha et al.

(10) Patent No.: US 12,260,909 B2
(45) Date of Patent: Mar. 25, 2025

(54) METHOD OF OPERATING SELECTOR DEVICE, METHOD OF OPERATING NONVOLATILE MEMORY APPARATUS USING THE SAME, ELECTRONIC CIRCUIT DEVICE INCLUDING SELECTOR DEVICE, AND NONVOLATILE MEMORY APPARATUS

(71) Applicants: SK hynix Inc., Icheon (KR); Foundation for Research and Business, Seoul National University of Science and Technology, Seoul (KR); INDUSTRY-UNIVERSITY COOPERATION FOUNDATION HANYANG UNIVERSITY ERICA CAMPUS, Ansan (KR)

(72) Inventors: Tae Jung Ha, Icheon (KR); Soo Gil Kim, Icheon (KR); Jeong Hwan Song, Icheon (KR); Byung Joon Choi, Seoul (KR); Ha Young Lee, Seoul (KR)

(73) Assignees: SK hynix Inc., Icheon (KR); FOUNDATION FOR RESEARCH AND BUSINESS, SEOUL NATIONAL UNIVERSITY OF SCIENCE AND TECHNOLOGY, Seoul (KR); INDUSTRY-UNIVERSITY COOPERATION FOUNDATION HANYANG UNIVERSITY ERICA CAMPUS, Ansan (KR)

( * ) Notice: Subject to any disclaimer, the term of this patent is extended or adjusted under 35 U.S.C. 154(b) by 195 days.

(21) Appl. No.: 18/188,332

(22) Filed: Mar. 22, 2023

(65) Prior Publication Data
US 2023/0326523 A1    Oct. 12, 2023

(30) Foreign Application Priority Data
Mar. 23, 2022    (KR) .......................... 10-2022-0036253

(51) Int. Cl.
| | | |
|---|---|---|
| *G11C 7/00* | (2006.01) | |
| *G11C 11/16* | (2006.01) | |
| *G11C 13/00* | (2006.01) | |

(52) U.S. Cl.
CPC ........ *G11C 13/003* (2013.01); *G11C 11/1659* (2013.01); *G11C 2213/72* (2013.01)

(58) Field of Classification Search
CPC ............ G11C 11/406; G11C 11/40615; G11C 2211/4061; G11C 11/49618; G11C 2211/4067
(Continued)

(56) References Cited

U.S. PATENT DOCUMENTS

| | | | |
|---|---|---|---|
| 10,079,060 B2 | 9/2018 | Jo et al. | |
| 2003/0156468 A1* | 8/2003 | Campbell | ............ H10N 70/245 257/E45.002 |

FOREIGN PATENT DOCUMENTS

KR    100508836 B1    8/2005

* cited by examiner

*Primary Examiner* — Son T Dinh

(57) ABSTRACT

Operating a selector device that controls access of a signal to a memory element may comprise applying a main operating voltage pulse and a refresh voltage pulse to the selector device. The refresh voltage pulse and main operating voltage pulse have opposite polarities. A magnitude of the main operating voltage pulse is greater than or equal to a threshold voltage for turning on the selector device, and a maximum magnitude of the refresh voltage pulse is less than the threshold voltage. The refresh voltage pulse reduces a difference between the threshold voltage and a turn-off voltage of the selector device, and may be applied immediately before or immediately after the main operating voltage pulse. An electronic circuit may include the selector device and a driving circuit for apply the pulses. A nonvolatile
(Continued)

memory may include the driving circuit and a plurality of nonvolatile memory elements each including a selector device.

26 Claims, 14 Drawing Sheets

(58) Field of Classification Search
USPC .......................................................... 365/222
See application file for complete search history.

[ Comparative example ]

< Results of DC application >

[ Comparative example ]

< AC single pulse >

[ Comparative example ]
< $V_{th}$ Tendency >

[ Comparative example ]
< $V_{hold}$ Tendency >

(A)                              (B)

< Application of post-refresh pulse >

(A) < $V_{th}$ Tendency >

(B) < $V_{hold}$ Tendency >

< Application of post-refresh pulse >

(A)  (B)

< Adjustment of refresh voltage intensity >

< -0.6V, $V_{th}$ Tendency >     < V Adjustment $V_{th}$ Tendency >

(A)     (B)

< -0.6V, $V_{hold}$ Tendency >     < V Adjustment $V_{hold}$ Tendency >

(A)     (B)

< Adjustment conditions of refresh pulse width >

(A)

(B)

< Refresh:- / Main:+ >

< Refresh:+ / Main:- >

[ Comparative example ]

< Application of pre-pulse having the same polarity >

[ Comparative example ]
< $V_{th}$ Tendency >

[ Comparative example ]
< $V_{hold}$ Tendency >

(A)  (B)

METHOD OF OPERATING SELECTOR DEVICE, METHOD OF OPERATING NONVOLATILE MEMORY APPARATUS USING THE SAME, ELECTRONIC CIRCUIT DEVICE INCLUDING SELECTOR DEVICE, AND NONVOLATILE MEMORY APPARATUS

CROSS REFERENCE TO RELATED APPLICATION

The present application claims priority under 35 U.S.C. § 119 (a) to Korean application No. 10-2022-0036253, filed on Mar. 23, 2022, which is herein incorporated by reference in its entirety.

BACKGROUND

1. Field

The present invention relates to an electronic device, an apparatus, and an operating method thereof, and more particularly, to a method of operating a selector device, a method of operating a nonvolatile memory apparatus using the same, an electronic circuit device including a selector device, and a nonvolatile memory apparatus.

2. Description of the Related Art

Next-generation memories based on resistance change, such as a resistive random access memory (ReRAM), a phase-change RAM (PCRAM), and a magnetic RAM (MRAM) have nonvolatile characteristics, which may greatly reduce power consumption while providing advantages such as high speed and high reliability. In addition, the simple structure of the next-generation memories enables higher than conventional NAND flash memories, and when manufactured in a crossbar array structure, a large-capacity next-generation memory device may be implemented with the $4F^2$ design rule (i.e., with closely-packed memory cells each having an area of approximately the 4 times the square of the minimum feature size F).

In a memory having a crossbar array structure, memory cells are positioned at intersections of word lines and bit lines. In such a structure, due to a sneak current generated from unselected cells during the read/write process of the memory, information reading errors may occur, a sensing margin may be reduced, a maximum size (capacity) of memory which may be integrated may be limited, or combinations thereof. In order to suppress such a sneak (leakage) current component, a selector device suitable for the memory may be used.

In an integrated memory structure, when a selector device is connected in series with a memory element in each cell, the sneak current generated in an unselected cell is blocked or reduced by the selector device, thereby preventing occurrences of information errors during memory operations. In such a cell, the operating voltage may be different depending on the variable resistor whose resistance changes, both because of differences in a material of the memory layer even within the same type of memory, as well as because of the type of memory connected to the selector device. Because of this variability in the operating voltage of the cell, the operating characteristics of the selector device required may differ as well. Therefore, the operating voltage of the selector device must be determined in consideration of the operating voltage of the memory element connected thereto, and for this purpose, it is necessary to precisely control the structure and material of the selector device.

In a structure in which the selector device and the memory element are connected, a snapback phenomenon of the selector device may lead to deteriorating memory characteristics. The snapback phenomenon occurs due to a difference between a threshold voltage at which the selector device is turned on and a hold voltage at which the selector device is turned off; the region between the threshold voltage and the hold voltage is referred to as a snapback region. A voltage corresponding to the snapback region may be additionally applied to the memory element undesirably, and thus, the characteristics of the memory cell may be deteriorated.

In the related art, a hardware approach has been adopted to reduce the snapback phenomenon. For example, an attempt was made to reduce the snapback phenomenon by adjusting the composition, thickness, or size of the selector device, or by connecting an external resistor to the selector device. However, in such hardware approaches, various problems and limitations arise due to changes in physical (hardware) conditions. For example, when the composition of the selector device is controlled to reduce the snapback phenomenon, it may be impossible to adjust the operating voltage in the selector device manufactured with a specific composition. In addition, when adjusting a thickness of the selector device, it may be difficult to manufacture a device having the desired thickness, and when the thickness is increased for optimal operating conditions, the overall scale of the device may increase. And while the snapback phenomenon tends to decrease as the size of the element increases, adjusting the size of the selector device to decrease the snapback phenomena increases the overall scale of the element. And when an external resistor is connected to the selector device to reduce the snapback phenomena, problems related to fabrication and scale of the memory element arise.

SUMMARY

A technological objective of the present invention is to provide a method of operating a selector device that effectively suppresses or prevents a snapback phenomenon of the selector device within the same physical structure, as opposed to using a hardware method based on a reconfiguration of the physical structure.

In addition, a technological objective of the present invention is to provide a method of operating a nonvolatile memory apparatus to which the method of operating a selector device is applied.

In addition, a technological objective of present invention is to provide an electronic circuit device including the selector device and a driving circuit for operating the selector device.

In addition, a technological objective of the present invention is to provide a nonvolatile memory apparatus to which the selector device and the driving circuit are applied.

The objects to be solved by the present invention are not limited to the problems mentioned above, and other objects not mentioned will be understood by those skilled in the art from the description below.

According to a first embodiment of the present invention, a method of operating a selector device of a memory element comprises applying a main operating voltage pulse to a switching layer of the selector device through first and second electrodes of the selector device, a magnitude of a voltage of the main operating voltage pulse being greater than or equal to a magnitude of a threshold voltage for turning on the selector device; and applying a refresh voltage pulse having a polarity opposite to that of the main operating voltage pulse to the switching layer through the first and second electrodes, a maximum magnitude of a voltage of the refresh voltage pulse being less than the magnitude of the threshold voltage.

A difference between the threshold voltage at which the selector device is turned on and a hold voltage at which the selector device is turned off may be reduced by the application of the refresh voltage pulse.

The switching layer may comprise an insulator matrix and a non-insulating material disposed within the insulator matrix.

The non-insulating material may include a nanocluster, and the nanocluster may include at least one of a metal element and a semiconductor element.

The insulator matrix may include at least one selected from a group consisting of silicon oxide, magnesium oxide, aluminum oxide, titanium oxide, chromium oxide, nickel oxide, copper oxide, zinc oxide, yttrium oxide, niobium oxide, lanthanum oxide, hafnium oxide, tantalum oxide, tungsten oxide, zirconium oxide, manganese oxide, iron oxide, antimony oxide, silicon nitride, and aluminum nitride.

The non-insulating material may include at least one selected from a group consisting of arsenic (As), phosphorus (P), antimony (Sb), bismuth (Bi), silicon (Si), germanium (Ge), tin (Sn), lead (Pb), aluminum (Al), gallium (Ga), indium (In), silver (Ag), gold (Au), palladium (Pd), platinum (Pt), iridium (Ir), ruthenium (Ru), molybdenum (Mo), tungsten (W), tantalum (Ta), titanium (Ti), zirconium (Zr), hafnium (Hf), magnesium (Mg), calcium (Ca), lithium (Li), sodium (Na), lanthanum (La), niobium (Nb), vanadium (V), chromium (Cr), and copper (Cu).

The refresh voltage pulse may be applied immediately after applying the main operating voltage pulse.

The refresh voltage pulse may be applied immediately before applying the main operating voltage pulse.

A plurality of main operating voltage pulses may be applied to the switching layer, and the refresh voltage pulse may be applied between each pair of adjacent main operating voltage pulses in the plurality of main operating voltage pulses.

The maximum magnitude of the voltage of the refresh voltage pulse may be between 0.1 V and 1.0 V.

A duration of the refresh voltage pulse may be between 0.1 microseconds and 10 milliseconds.

The magnitude of the voltage of the main operating voltage pulse may be between 0.5 V and 5 V, and a duration of the main operating voltage pulse may be between 10 nanoseconds and 100 microseconds.

According to a second embodiment of the present invention, a nonvolatile memory apparatus comprises a plurality of memory cells arranged at intersections between a plurality of first electrode lines and a plurality of second electrode lines, each of the plurality of memory cells including a memory element having a nonvolatile property and a selector device connected in series with the memory element. A method of operating a nonvolatile memory apparatus includes the method of operating a selector device according to the first embodiment, described above.

According to a third embodiment of the present invention, an electronic circuit device comprises a first electrode, a second electrode, a memory element, a selector device including a switching layer for controlling access of a signal to the memory element, and a driving circuit. The driving circuit is configured to apply a main operating voltage pulse to the selector device through the first and second electrodes, a magnitude of a voltage of the main operating voltage pulse being greater than or equal to a magnitude of a threshold voltage for turning on the selector device; and apply a refresh voltage pulse having a polarity opposite to that of the main operating voltage pulse to the selector device through the first and second electrodes, a maximum magnitude of a voltage of the refresh voltage pulse being less than the magnitude of the threshold voltage.

A difference between the threshold voltage and a hold voltage at which the selector device is turned off may be reduced by the application of the refresh voltage pulse.

The switching layer may comprise an insulator matrix and a non-insulating material disposed within the insulator matrix.

The non-insulating material may include a nanocluster, and the nanocluster may include at least one of a metal element and a semiconductor element.

The insulator matrix may include at least one selected from a group consisting of silicon oxide, magnesium oxide, aluminum oxide, titanium oxide, chromium oxide, nickel oxide, copper oxide, zinc oxide, yttrium oxide, niobium oxide, lanthanum oxide, hafnium oxide, tantalum oxide, tungsten oxide, zirconium oxide, manganese oxide, iron oxide, antimony oxide, silicon nitride, and aluminum nitride.

The non-insulating material may include at least one selected from a group consisting of arsenic (As), phosphorus (P), antimony (Sb), bismuth (Bi), silicon (Si), germanium (Ge), tin (Sn), lead (Pb), aluminum (Al), gallium (Ga), indium (In), silver (Ag), gold (Au), palladium (Pd), platinum (Pt), iridium (Ir), ruthenium (Ru), molybdenum (Mo), tungsten (W), tantalum (Ta), titanium (Ti), zirconium (Zr), hafnium (Hf), magnesium (Mg), calcium (Ca), lithium (Li), sodium (Na), lanthanum (La), niobium (Nb), vanadium (V), chromium (Cr), and copper (Cu).

The refresh voltage pulse may be immediately applied after applying the main operating voltage pulse.

The refresh voltage pulse may be applied immediately before applying the main operating voltage pulse.

A plurality of main operating voltage pulses may be applied to the switching layer, and the refresh voltage pulse may be applied between each pair of adjacent main operating voltage pulses in the plurality of main operating voltage pulses.

The maximum magnitude of the voltage of the refresh voltage pulse may be between 0.1 V and 1.0 V.

A duration of the refresh voltage pulse may be between 0.1 microseconds and 10 milliseconds.

The magnitude of the voltage of the main operating voltage pulse may be between 0.5 V to 5 V, and a duration of the main operating voltage pulse may be between 10 nanoseconds and 100 microseconds.

According to a fourth embodiment of the present invention, a nonvolatile memory apparatus comprises a memory device including a plurality of first electrode lines, a plurality of second electrode lines, and a plurality of memory cells arranged at intersections between the plurality of first electrode lines and the plurality of second electrode lines. Each of the plurality of memory cells including a memory element having a nonvolatile property and a selector device connected in series with the memory element. The nonvolatile memory apparatus further comprises a memory control circuit for controlling an operation of the memory device, the memory control circuit including a driving circuit for driving the selector device. The selector device and the driving circuit constitute the electronic circuit device according the third embodiment described above.

DETAILED DESCRIPTION

Figure 1:
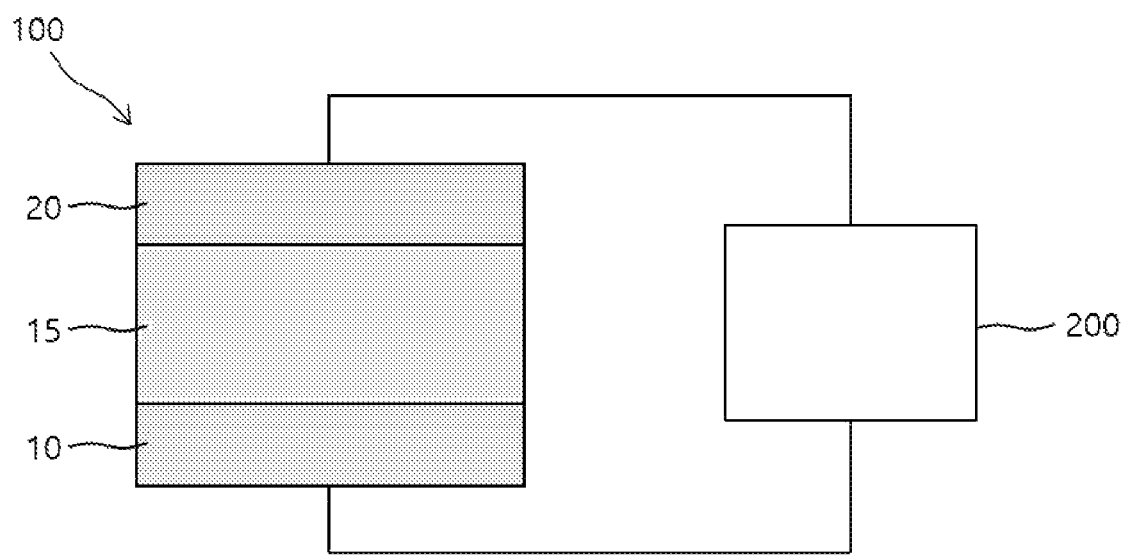
FIG. 1 illustrates an electronic circuit device including a selector device in which an operating technique according to an embodiment of the present invention may be applied.

Hereinafter, the embodiments of the present invention will be described in detail with reference to the accompanying drawings.

The embodiments of the present invention to be described below are provided to clearly explain the present invention to those having ordinary knowledge in the related art, and the scope of the present invention is not limited by the following embodiments. The following embodiment may be modified in many different forms.

The terminology used herein is used to describe specific embodiments, and is not used to limit the present invention. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present specification, when a member is said to be located "on" another member, this includes not only a case in which a member is in contact with another member but also a case in which another member is present between the two members. As used herein, the term "and/or" includes any one and any combination of one or more of those listed items. In addition, as used herein, terms such as "about", "substantially", etc. are used as a range of the numerical value or degree, in consideration of inherent manufacturing and material tolerances, or as a meaning close to the range. Furthermore, the present application is intended to prevent an infringer from using unfairly the disclosed contents describing the accurate or the absolute numbers provided to aid the understanding of the present invention.

Hereinafter, the embodiments of the present invention will be described in detail with reference to the accompanying drawings. The size or the thickness of the regions or the parts illustrated in the accompanying drawings may be slightly exaggerated for clarity and convenience of description. The same reference numerals refer to the same elements throughout the detailed description.

FIG. 1 is a diagram for explaining an electronic circuit device including a selector device and an operating technique for the selector device according to an embodiment of the present invention.

Referring to FIG. 1, an electronic circuit device according to an embodiment of the present invention may include a selector device 100, and a driving circuit 200 electrically connected to the selector device 100.

The selector device 100 is an element for controlling access of a signal to an information storage element (i.e., memory element) (not shown), and may block or minimize a sneak current generated in an unselected cell of a memory array. The selector device 100 may include a first electrode 10 and a second electrode 20, and a switching layer 15 disposed between these electrodes. For example, the first electrode 10 may be disposed as a lower electrode of the switching layer 15 and the second electrode 20 may be disposed as an upper electrode of the switching layer 15. The first electrode 10 and the second electrode 20 may be provided or shared by wires of the electronic circuit device or electrodes of another memory device. This will be described separately later.

The switching layer 15 may include an insulator matrix and a non-insulating material element disposed within the insulator matrix. Here, the non-insulating material element may include a nanocluster. For example, a plurality of nanoclusters may be dispersed and disposed in the insulator matrix. The nanocluster may include at a metal element, a semiconductor element, or both. The metal element and the semiconductor element may be referred to as a dopant. The insulator matrix of the switching layer 15 may include defects therein, and the selector device 100 may be a two-terminal device operated based on the transfer of electric charges to and from the defects in the insulator matrix, and formation of a conduction path between the insulator matrix and the nanocluster (dopant).

The insulator matrix may include an oxide of a metal, an oxide of a metalloid, an oxide of a nonmetal, or a combination thereof. For example, the insulator matrix may include at least one selected from a group consisting of silicon oxide ($SiO_2$), magnesium oxide (MgO), aluminum oxide ($Al_2O_3$), titanium oxide ($TiO_2$), chromium oxide ($Cr_2O_3$), nickel oxide (NiO), Copper Oxide ($CuO_x$), Zinc Oxide (ZnO), Yttrium Oxide ($Y_2O_3$), Niobium Oxide ($Nb_2O_5$), Lanthanum Oxide ($La_2O_3$), Hafnium Oxide ($HfO_2$), Tantalum Oxide ($Ta_2O_5$), Tungsten Oxide ($WO_3$), zirconium oxide, manganese oxide, iron oxide, antimony oxide, silicon nitride, and aluminum nitride. The non-insulating material element may include at least one selected from a group consisting of arsenic (As), phosphorus (P), antimony (Sb), bismuth (Bi), silicon (Si), germanium (Ge), tin (Sn), lead (Pb), aluminum (Al), gallium (Ga), indium (In), silver (Ag), gold (Au), palladium (Pd), platinum (Pt), iridium (Ir), ruthenium (Ru), molybdenum (Mo), tungsten (W), tantalum (Ta), titanium (Ti), zirconium (Zr), hafnium (Hf), magnesium (Mg), calcium (Ca), lithium (Li), sodium (Na), lanthanum (La), niobium (Nb), vanadium (V), chromium (Cr), and copper (Cu), for example.

The non-insulating material element may be a dopant, and the insulator matrix may be doped with the metal element, the semiconductor element, or both. As a result, the switching layer 15 may be composed of an insulator matrix doped with the dopant. Here, doping may be performed using an ion implantation process. Defects required in the insulator matrix may be induced in a process for doping the dopant into the insulator matrix via the ion implantation. A doping concentration (ion implantation concentration) of the dopant may be between $1\times10^{21}$ and $1\times10^{25}$ atoms/cm$^3$.

As a non-limiting example, when the non-insulating material element is arsenic (As), the switching layer 15 may include silicon oxide ($SiO_x$) doped with arsenic (As), where arsenic may correspond to a metal element dopant, and the silicon oxide may correspond to the insulator matrix, and such a composition may be expressed as As:$SiO_x$. The silicon oxide ($SiO_x$) may be stoichiometric $SiO_2$ or may be deficient in oxygen, but the present invention is not limited thereto. The doping concentration of As may be between $1\times10^{21}$ and $1\times10^{25}$ atoms/cm$^3$.

The metal elements may be substantially uniformly distributed in the insulator matrix, and the distribution of the metal elements may be layered so that the metal element layer and the insulator layer may be alternately disposed two or more times to provide the switching layer 15. In the above-mentioned layer of the metal element, it may be a layer defined by dispersing atoms of a metal element, or clusters of atoms thereof at a predetermined density within the same layer, rather than a continuous metal film. Alternatively, for example, one large cluster composed of metal elements may be included inside the thin film (insulator). In some cases, the atoms and the clusters may be mixed.

In the case of an As:$SiO_2$-based device according to an embodiment, in particular, oxygen vacancy defects in $SiO_2$ may have a stable energy level as a neutral defect having a dimer structure in the vicinity of a valence band according to the state of charge of electrons, and a form of charge defects of positive polarity with an energy level similar to the work function of As in the middle of the band gap. Two types of defects may act as oxygen vacancy defects with variable energy levels due to the charging and discharging of holes caused by the electric field. As a result, a tunneling path composed of charging defects is formed inside the $SiO_2$ by hole charging may act as a major factor in resistance change.

The first and second electrodes 10 and 20 may include metal or a conductive metal compound. Here, the metal compound may be a metal nitride, a metal oxide, a metal carbide, or a mixture or a compound therebetween. At least one of the first and second electrodes 10 and 20 may include at least one of titanium nitride, tantalum nitride, tungsten nitride, tungsten, aluminum, copper, tantalum, titanium, gold, platinum, silver, ruthenium, iridium, and molybdenum. In one embodiment, the first and second electrodes 10 and 20 may include TiN (titanium nitride) or may be formed of TiN.

The driving circuit 200 may be configured to apply a main operating voltage pulse and a refresh voltage pulse having a polarity opposite to that of the main operating voltage pulse to the switching layer 15 through the first and second electrodes 10 and 20. The refresh voltage pulse may be applied at least one of before and after application of the main operating voltage pulse. The main operating voltage pulse may have a voltage of a magnitude (that is, an absolute value) greater than or equal to the magnitude of a threshold voltage for turning on the selector device 100, and the refresh voltage pulse may have a polarity opposite to that of the main operating voltage pulse and a maximum magnitude of a voltage of the refresh voltage pulse may be smaller than the magnitude of the threshold voltage. The main operating voltage pulse and the refresh voltage pulse will be described in more detail with reference to FIG. 2 in the following paragraphs. A memory element may be connected in series to the switching layer 15 so that a memory cell including the selector device may be defined, and each memory cell may connected to the driving circuit 200 through wires for cell access such as a bit line and/or a word line so that information may be stored or logical operations may be performed.

Figure 2:
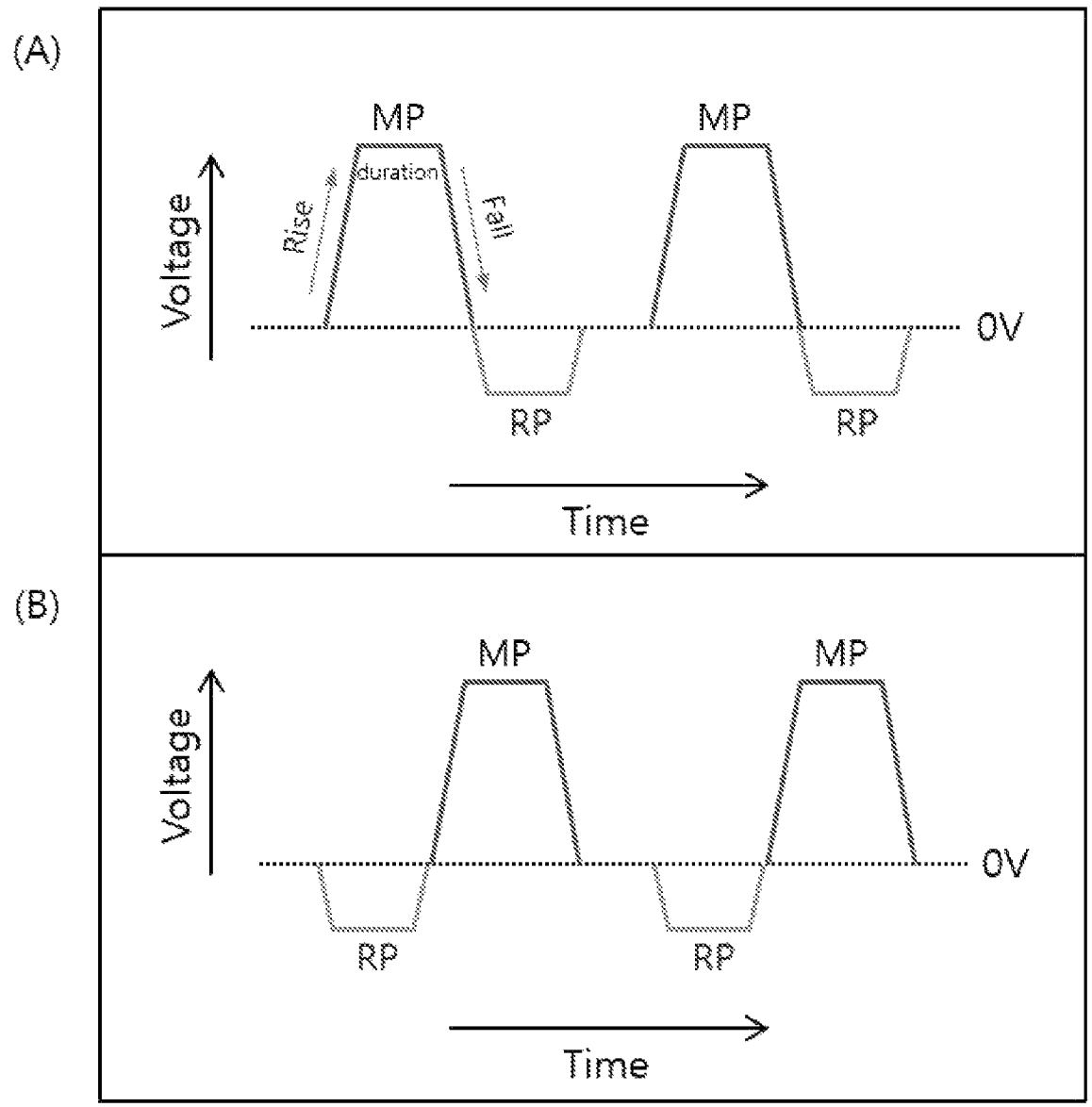
FIG. 2 is a graph schematically showing a main operating voltage pulse and a refresh voltage pulse applicable to a technique of operating a selector device according to an embodiment of the present invention.

FIG. 2 is a graph schematically showing a main operating voltage pulse (MP) and a refresh voltage pulse RP applicable to a technique for operating a selector device according to an embodiment of the present invention. Diagram (A) of FIG. 2 is according to one embodiment, diagram (B) is according to another embodiment.

Referring to FIG. 2, a technique for operating a selector device according to an embodiment of the present invention may include applying a main operating voltage pulse MP to a switching layer of the selector device and applying a refresh voltage pulse RP having a polarity opposite to that of the main operating voltage pulse MP to the switching layer. When the main operating voltage pulse MP is a positive (+) voltage pulse, the refresh voltage pulse RP is a negative (−) voltage pulse, and when the main operating voltage pulse MP is a negative (−) voltage pulse, the refresh voltage pulse RP is a positive (+) voltage pulse. In this respect, the refresh voltage pulse RP may be referred to as a reverse voltage pulse.

The main operating voltage pulse MP may have a voltage level sufficient for turning on the selector device. The selector element may be turned on and then turned off by the main operating voltage pulse MP. The main operating voltage pulse MP may have a rising section in which the voltage rises, a duration section in which the voltage is maintained, and a falling section in which the voltage falls. The selector device may be turned on during the rising section, and the selector device may be turned off during the falling section. In contrast, the magnitude of voltages of the refresh voltage pulse RP may be kept smaller than a magnitude of the voltage for turning on the selector device, and the voltages of the refresh voltage pulse RP have an opposite polarity to the voltage for turning on the selector device. Accordingly, a maximum magnitude (absolute value) of the voltage of the refresh voltage pulse RP may be smaller than the magnitude of a voltage of the main operating voltage pulse MP. The refresh voltage pulse RP may be applied before, after, or both before and after the application of the main operating voltage pulse MP.

Diagram (A) of FIG. 2 shows a case in which the refresh voltage pulse RP is applied after the main operating voltage pulse MP is applied. Accordingly, in this case, the refresh voltage pulse RP may be referred to as a post-refresh voltage pulse or a post-voltage pulse. The main operating voltage pulse MP and the subsequent refresh voltage pulse RP may be contiguously applied without a time interval between them. In this way, when the main operating voltage pulse MP and the subsequent refresh voltage pulse RP are contiguously applied, operating the selector may be simplified and operating efficiency may be improved. However, in some cases, a predetermined time interval may exist between the application of the main operating voltage pulse MP and application of the refresh voltage pulse RP.

Diagram (B) of FIG. 2 shows a case in which the refresh voltage pulse RP is applied before the main operating voltage pulse MP is applied. Accordingly, in this case, the refresh voltage pulse RP may be referred to as a pre-refresh voltage pulse or a pre-voltage pulse. The refresh voltage pulse RP and the subsequent main operating voltage pulse MP may be contiguously applied without a time interval between them. In this way, when the refresh voltage pulse RP and the subsequent main operating voltage pulse MP are contiguously applied, the operating the selector may be simplified and operation efficiency may be improved. However, in some cases, a predetermined time interval may exist between the application of the refresh voltage pulse RP and the application of the main operating voltage pulse MP.

In (A) and (B) of FIG. 2, a plurality of main operating voltage pulses MP may be sequentially applied to the switching layer of the selector device. In this case, the refresh voltage pulse RP may be applied between every two adjacent main operating voltage pulses MP among the plurality of main operating voltage pulses MP.

According to one embodiment, the magnitude (absolute value) of the voltage of the main operating voltage pulse MP may be, for example, between 0.5 V and 5 V. The duration time of the main operating voltage pulse MP may be, for example, between 10 nanoseconds (ns) and 100 microseconds (μs). The rise time of the main operating voltage pulse MP may be, for example, between 0.05 μs and 30 μs. The fall time of the main operating voltage pulse MP may be, for example, between 0.05 μs and 30 μs. Each of the rise time and fall time of the main operating voltage pulse MP may be shorter than or equal to the duration time. However, the aforementioned intensity, duration time, rise time, and fall time conditions of the main operating voltage pulse MP are illustrative and may be adjusted to the values having different ranges depending on the type of switching layer.

According to an embodiment, the absolute value of the intensity of the refresh voltage pulse RP may be, for example, between 0.1 V and 1.0 V or between 0.2 V and 0.7 V. The duration time of the refresh voltage pulse RP may be, for example, between 0.1 μs and 10 ms or between 1 μs and 500 μs. When these conditions are satisfied, the effect of applying the refresh voltage pulse RP may be improved. However, the intensity and duration conditions of the refresh voltage pulse RP described above are illustrative and may vary depending on circumstances. For example, application conditions of the refresh voltage pulse RP may vary depending on the type of the selector device and the material constituting the selector device (such as the material constituting the switching layer).

According to an embodiment of the present invention, by the application of the refresh voltage pulse RP, a difference between the threshold voltage $V_{th}$ at which the selector device is turned on and a hold voltage $V_{hold}$ at which the selector device is turned off may decrease. The difference between the threshold voltage $V_{th}$ and the hold voltage $V_{hold}$ may be reduced by a refresh effect (which may be interpreted as a recovery effect or a pretreatment effect in another aspect) caused by the refresh voltage pulse RP. Accordingly, a snapback region (and corresponding snapback period) of the selector device may be reduced by use of the refresh voltage pulse RP, and a snapback effect may be reduced. In this way, according to an embodiment of the present invention, a technique for operating a selector device capable of effectively suppressing or preventing a snapback phenomenon of the selector device may be implemented according to a software-like pulse programming technique which controls driving conditions while not changing a hardware system, in contrast to using a hardware technique. As a result of using the pulse programming technique of the embodiments, the snapback phenomenon may be effectively suppressed or prevented without adjusting a composition, a thickness, a size, or the like of the selector device and without connecting the selector device to a separate external resistor, and the operating characteristics of the selector device may be appropriately controlled as needed. Therefore, according to an embodiment of the present invention, as the snapback phenomenon is suppressed/prevented, a nonvolatile memory apparatus having excellent memory characteristics, a small cell size, and a high degree of integration may be more easily implemented.

Figure 3:
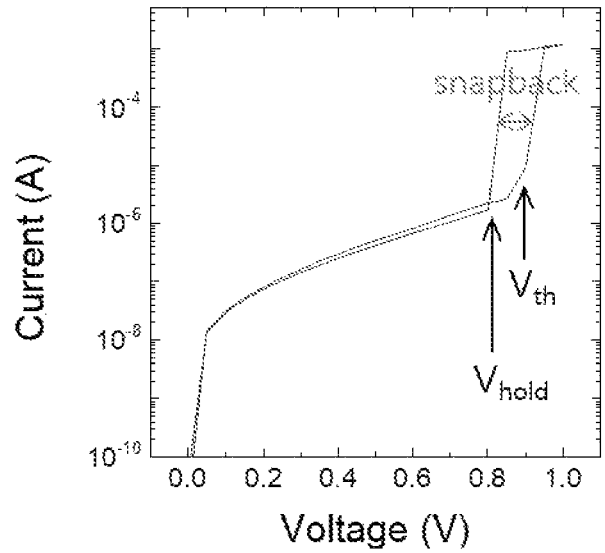
FIG. 3 is a graph showing a snapback phenomenon which occurs when a direct current (DC) voltage is applied to a selector device.

FIG. 3 is a graph showing a snapback phenomenon which occurs when a direct current (DC) voltage is applied to a selector device.

Referring to FIG. 3, when a direct current DC voltage is applied to the selector device for several milliseconds, it has a lower operating voltage as compared to the case that an alternating current AC voltage pulse is applied, and the threshold voltage $V_{th}$ and the hold voltage $V_{hold}$ may have a difference of about 0.1 V. The difference between the threshold voltage $V_{th}$ and the hold voltage $V_{hold}$ corresponds to the snapback region. The application of the direct current DC voltage may not be used under actual conditions of use of the selector device and is used herein for purely illustrative purposes.

Figure 4:
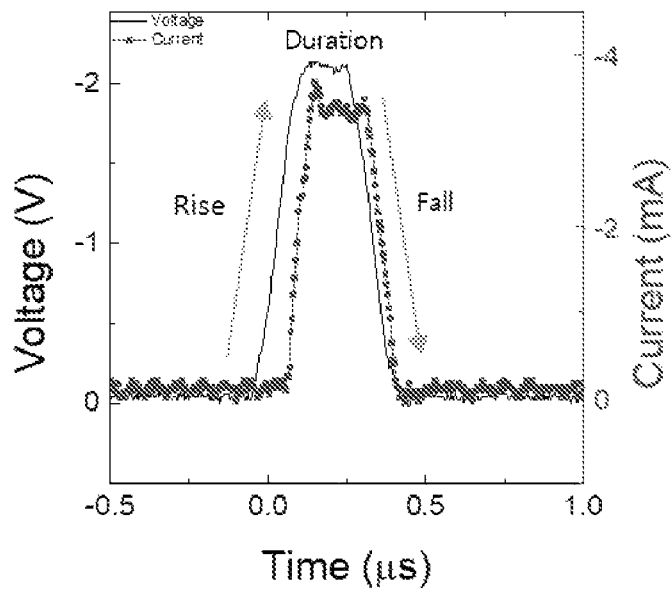
FIG. 4 is a graph showing a single pulse of alternating current (AC) voltage applied to a selector device and a corresponding change in current.

FIG. 4 is a graph showing a single pulse of alternating current (AC) voltage applied to a selector device and a corresponding change in current through the selector device. FIG. 4 shows a pulse condition according to a comparative example. In addition, FIG. 5 is a graph showing the change tendency of the threshold voltage $V_{th}$ and the change tendency of the hold voltage $V_{hold}$ according to the rise/fall time change of the single AC voltage pulse when the single AC voltage pulse as shown in FIG. 4 is applied to a selector device.

Referring to FIG. 4, in the case of the comparative example, a single pulse having a rise:duration:fall time ratio of 1:2:1 is applied in an actual use condition of a selector device, for example, in the range of several hundred nanoseconds to several tens of microseconds, and a refresh voltage pulse is not applied.

Figure 5:
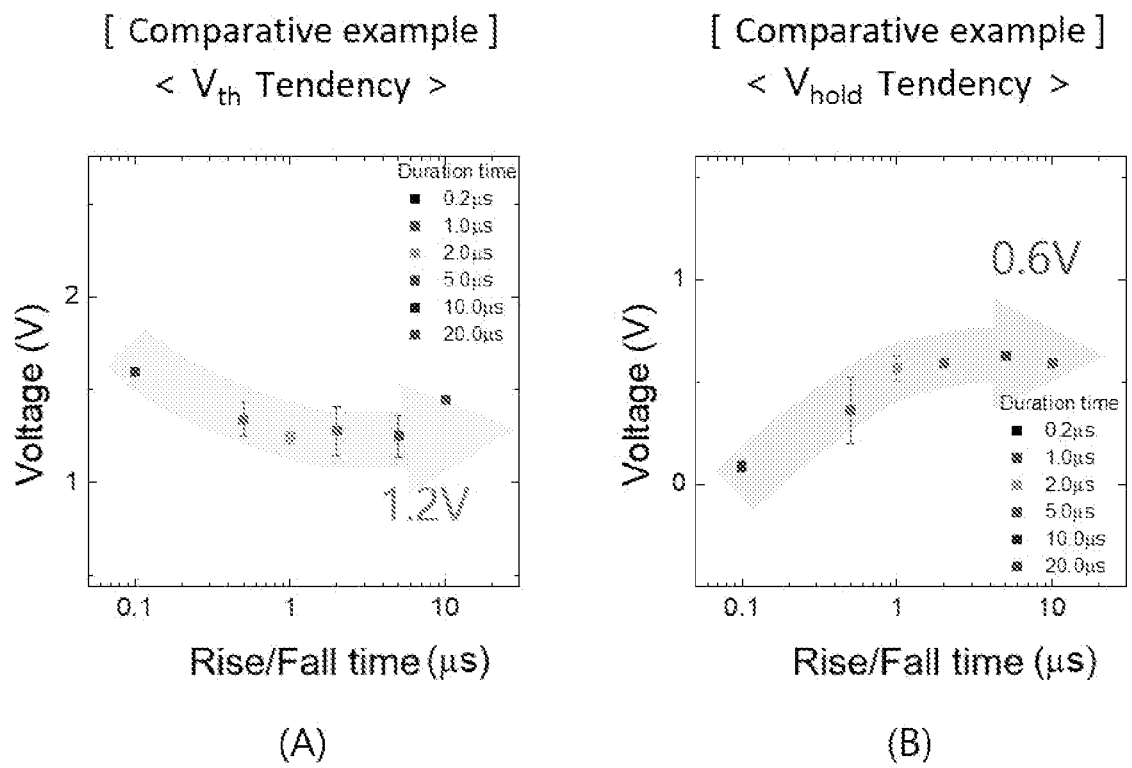
FIG. 5 is a graph showing the change tendency of the threshold voltage $V_{th}$ and the change tendency of the hold voltage $V_{hold}$ according to changes in rise and fall times of the single AC voltage pulse when the single AC voltage pulse as shown in FIG. 4 is applied to a selector device.

Referring to FIG. 5, the change tendency of the threshold voltage Vin is shown in graph (A), and the change tendency of the hold voltage $V_{hold}$ is shown in graph (B). Specifically, referring to the graph (A), it may be understood that as the rise time of the AC voltage single pulse increases, the threshold voltage $V_{th}$ of the selector device decreases from about 1.6 V to 1.2 V, and tends to converge (i.e., saturation) to about 1.2 V. Referring to the graph (B) of FIG. 5, as the fall time of the single pulse of the AC voltage increases, the hold voltage $V_{hold}$ of the selector device increases from about 0 V to 0.6 V, and tends to converge (i.e., saturation) to about 0.6 V.

From the above results with reference to FIG. 5, it may be seen that a relatively large difference between the threshold voltage $V_{th}$ and the hold voltage $V_{hold}$ occurs according to the comparative example. It may be difficult to reduce the difference between the threshold voltage $V_{th}$ and the hold voltage $V_{hold}$ even though the conditions of the alternating current AC voltage single pulse are variously adjusted. Therefore, in the case of the comparative example, it may be difficult to suppress the snapback phenomenon of the selector device.

Figure 6:
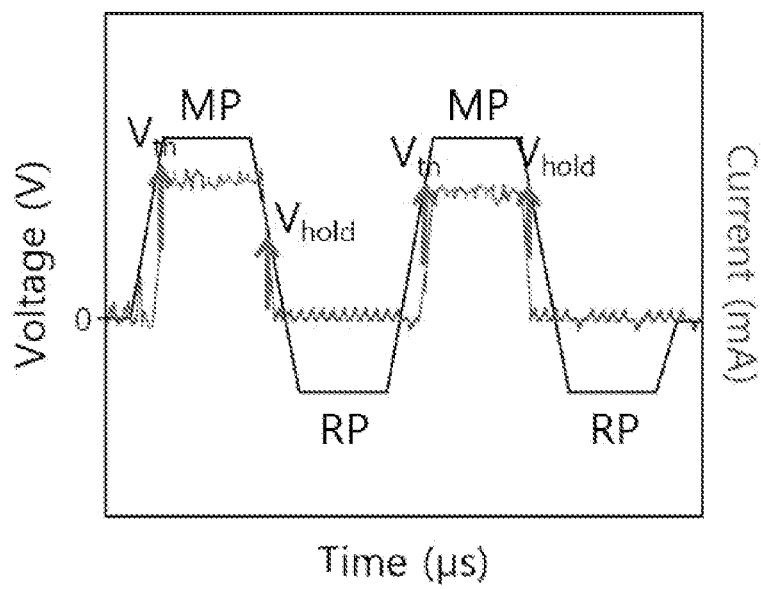
FIG. 6 is a graph showing a waveform of a voltage signal which may be applied to a selector device and a waveform of a current signal corresponding thereto as an example in a technique for operating a selector device according to an embodiment of the present invention.

FIG. 6 is a graph showing a waveform of a voltage signal which may be applied to a selector device and a waveform of a current signal corresponding thereto as an example in a technique for operating a selector device using a refresh voltage pulse RP according to an embodiment of the present invention.

Referring to FIG. 6, according to an embodiment of the present invention, the voltage signal applied to the selector device may include a main operating voltage pulse MP and a subsequent refresh voltage pulse RP. Here, the refresh voltage pulse RP may be a post-refresh voltage pulse. Immediately after applying the main operating voltage pulse MP for the threshold switching operation to the alternating current (AC) voltage application program, a pulse shape in which the refresh voltage pulse RP for applying a voltage of opposite polarity to main operating voltage pulse MP may additionally be applied.

Figure 7:
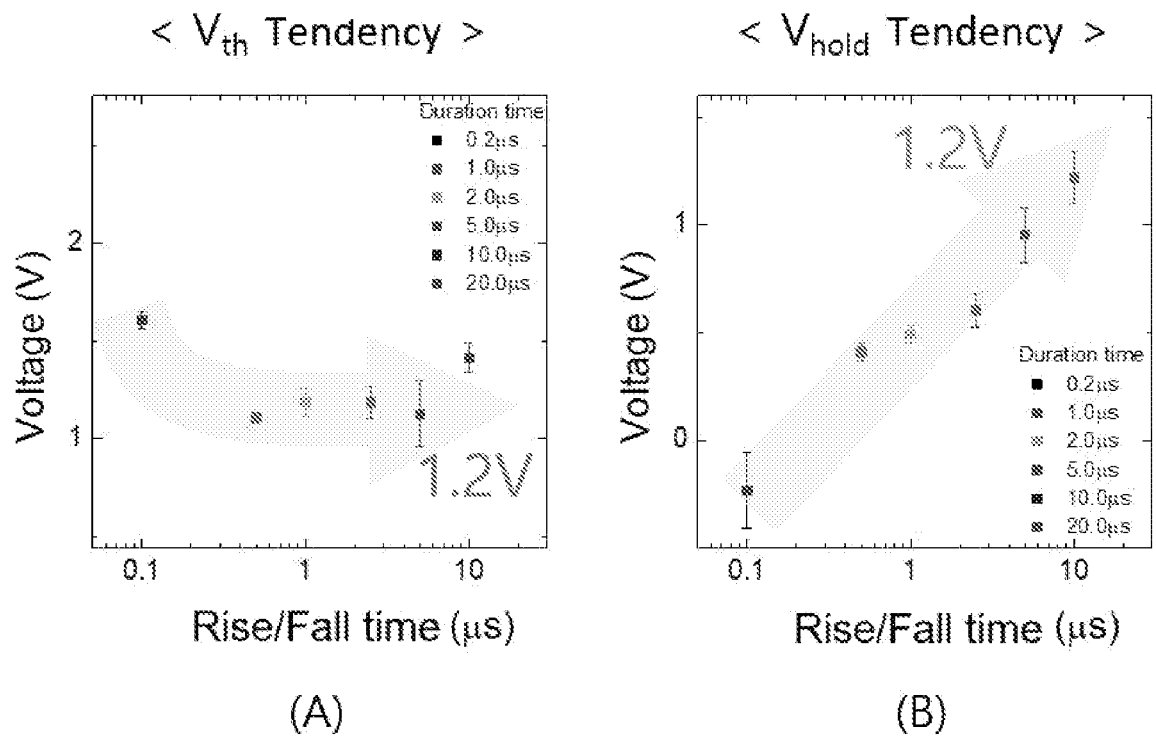
FIG. 7 is a graph showing a change tendency of the threshold voltage $V_{th}$ and a change tendency of the hold voltage $V_{hold}$ according to changes in rise and fall times of a main operating voltage pulse of a voltage signal when the voltage signal shown in FIG. 6 is applied to a selector device.

FIG. 7 is a graph showing a change tendency of the threshold voltage $V_{th}$ and a change tendency of the hold voltage $V_{hold}$ according to a change in the rise or fall time of the main operating voltage pulse MP of the voltage signal when the voltage signal shown in FIG. 6 is applied to the selector device. The graph (A) shows the change tendency of the threshold voltage $V_{th}$, and the graph (B) shows the change tendency of the hold voltage $V_{hold}$. At this time, the ratio of rise:duration:fall times in the main operating voltage pulse (MP) was 1:2:1.

Referring to the graph (A) of FIG. 7, when the refresh voltage pulse RP is added, it may be seen that as the rise time of the main operating voltage pulse MP increases, the threshold voltage $V_{th}$ of the selector device shows a tendency to converge to about 1.2 V.

Referring to graph (B) of FIG. 7, when the refresh voltage pulse RP is added, it may be seen that as the fall time of the main operating voltage pulse MP increases, the hold voltage $V_{hold}$ of the selector device shows a tendency to increase to about 1.2 V.

Comparing the result of FIG. 7 to the result of FIG. 5 using a single pulse, it may be seen that the difference between the threshold voltage $V_{th}$ and the hold voltage $V_{hold}$ may be reduced or eliminated by adding the refresh voltage pulse RP. The change tendency of the threshold voltage $V_{th}$ was similar to the graph (A) of FIG. 5, but in the case of the hold voltage $V_{hold}$, unlike the graph (B) of FIG. 5, it showed a tendency to increase to a similar level to the threshold voltage $V_{th}$. Because the application of the opposite polarity refresh voltage pulse RP has an effect of removing the turn-off suppression factor formed during the application of the previous main operating voltage pulse MP, it may produce the improved characteristics related to the hold voltage $V_{hold}$ in the next main operating voltage pulse MP. Therefore, when the technique according to the above embodiment is used, the snapback phenomenon of the selector device may be effectively suppressed or prevented.

Figure 8:
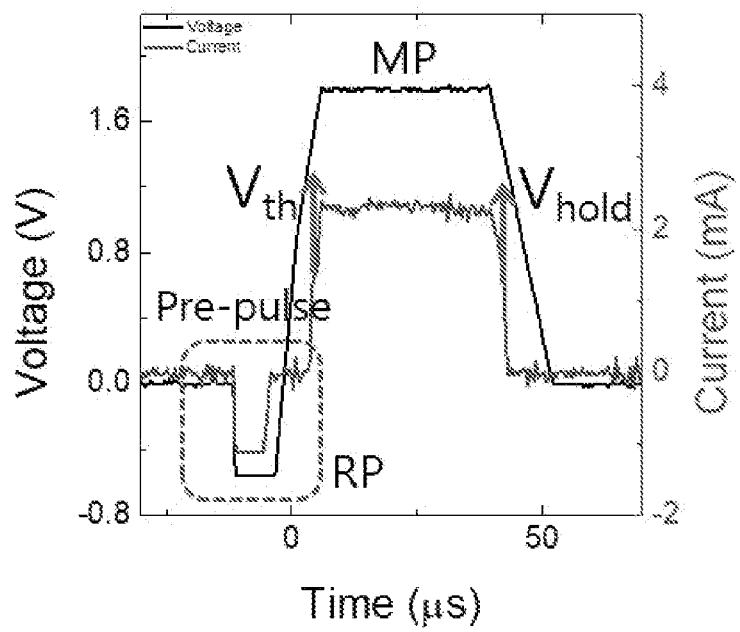
FIG. 8 is a graph showing a waveform of a voltage signal which may be applied to a selector device and a waveform of a current signal corresponding thereto as an example in a technique for operating a selector device according to another embodiment of the present invention.

FIG. 8 is a graph showing a waveform of a voltage signal which may be applied to a selector device and a waveform of a current signal corresponding thereto as an example in a technique for operating a selector device using a refresh voltage pulse RP according to another embodiment of the present invention.

Referring to FIG. 8, according to another embodiment of the present invention, the voltage signal applied to the selector device may include a refresh voltage pulse RP and a main operating voltage pulse MP following the refresh voltage pulse RP. Here, the refresh voltage pulse RP may be a pre-refresh voltage pulse. Here, immediately before the application of the main operating voltage pulse MP for the threshold switching operation, the refresh voltage pulse RP for applying a voltage of opposite polarity is additionally applied.

Figure 9:
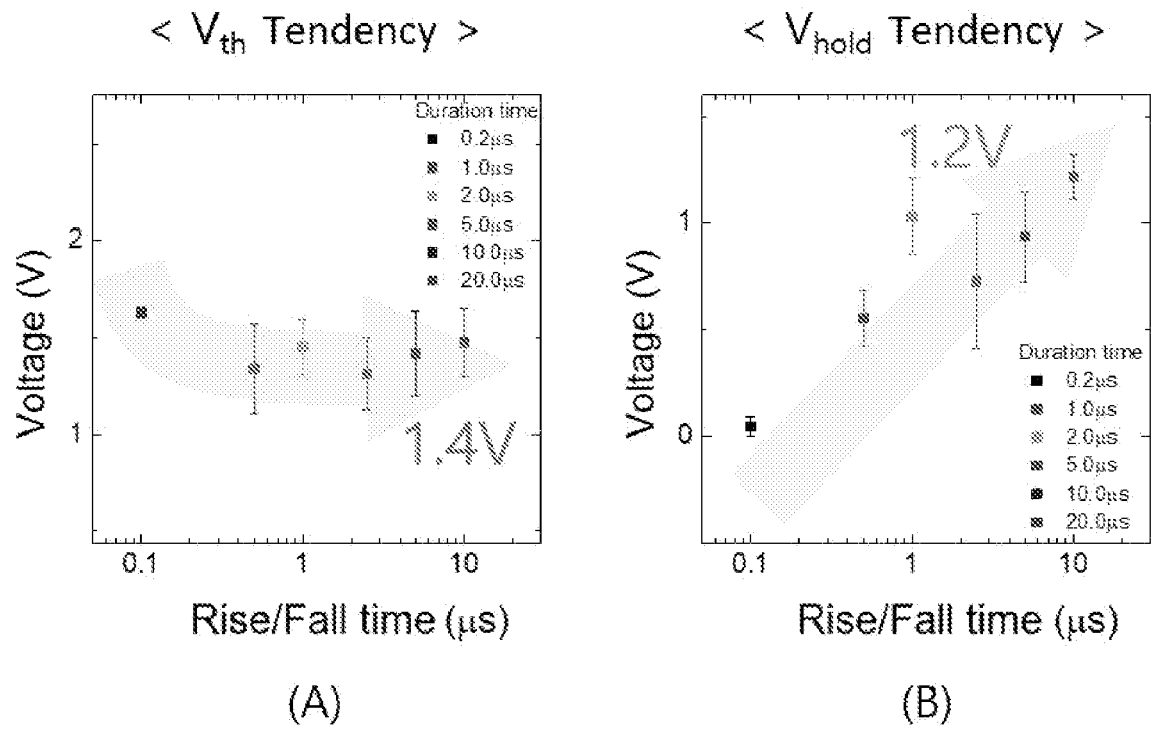
FIG. 9 is a graph showing a change tendency of the threshold voltage $V_{th}$ and a change tendency of a hold voltage $V_{hold}$ according to changes in rise and fall times of a main operating voltage pulse of a voltage signal when the voltage signal shown in FIG. 8 is applied to a selector device.

FIG. 9 is a graph showing a change tendency of the threshold voltage $V_{th}$ and a change tendency of a hold voltage $V_{hold}$ according to a change in the rise or fall time of the main operating voltage pulse MP of the voltage signal when the voltage signal shown in FIG. 8 is applied to the selector device. The graph (A) shows the change tendency of the threshold voltage $V_{th}$, and the graph (B) shows the change tendency of the hold voltage $V_{hold}$. In this example, the ratio of rise:duration:fall times in the main operating voltage pulse MP was 1:2:1.

Referring to graph (A) of FIG. 9, when the refresh voltage pulse RP is added, it may be seen that as the rise time of the main operating voltage pulse MP increases, the threshold voltage $V_{th}$ of the selector device shows a tendency to converge to about 1.4 V.

Referring to graph (B) of FIG. 9, when the refresh voltage pulse RP is added, it may be seen that as the fall time of the main operating voltage pulse MP increases, the hold voltage $V_{hold}$ of the selector device shows a tendency to increase to the degree of about 1.2 V.

Comparing the result of FIG. 9 to the result of FIG. 5 obtained by using a single pulse, it may be seen that the difference between the threshold voltage $V_{th}$ and the threshold voltage $V_{hold}$ may be reduced or eliminated by using the refresh voltage pulse RP. It may be seen that the change tendency of the threshold voltage $V_{th}$ is similar to the graph (A) of FIG. 5, but the voltage at which the threshold voltage $V_{th}$ converges is about 1.4 V slightly higher than that of 1.2 V of FIG. 5. When the refresh voltage pulse RP having an opposite polarity is added immediately before application of the main operating voltage pulse MP, the voltage at which the threshold voltage $V_{th}$ converges may be slightly increased. In the case of the hold voltage $V_{hold}$, unlike in the graph (B) of FIG. 5, showed a tendency to increase to a level similar to that of the threshold voltage $V_{th}$. Since the application of the opposite polarity refresh voltage pulse RP has the effect removing the turn-off suppression factor formed during the previous application of the main operating voltage pulse, it may produce the improvement of characteristics related to the hold voltage $V_{hold}$ in the main operating voltage pulse MP immediately after the application of the refresh voltage pulse RP. Therefore, when the technique according to the above embodiment is used, the snapback phenomenon of the selector device may be effectively suppressed or prevented.

Figure 10:
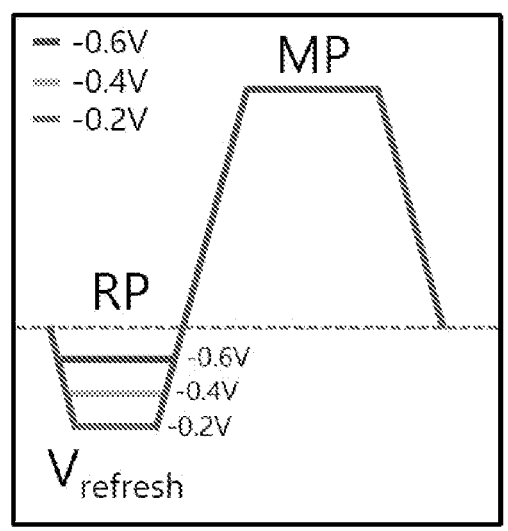
FIG. 10 is a graph showing a case where the intensity of a refresh voltage pulse is varied in a voltage signal which may be applied to a technique for operating a selector device according to an embodiment of the present invention.

FIG. 10 is a graph showing a case where the intensity of a refresh voltage pulse is varied in a voltage signal which may be applied in a technique for operating a selector device according to an embodiment of the present invention.

Referring to FIG. 10, the voltage signal applied to the selector device may include a refresh voltage pulse RP and a main operating voltage pulse MP following the refresh voltage pulse RP. Here, the refresh voltage pulse RP may be a pre-refresh voltage pulse. For example, the voltage of the refresh voltage pulse RP may be changed to −0.2 V, −0.4 V, and −0.6 V. In this embodiment, when the magnitude of the voltage of the refresh voltage pulse RP increases to about 0.8 V, the selector device may be turned on in the negative (−) direction and thus, the lower limit of the voltage of the refresh voltage pulse RP was set to −0.6 V. In the illustrated example, the voltage and time conditions of the main operating voltage pulse MP are fixed, and the time conditions of the refresh voltage pulse RP are also fixed.

Figure 11:
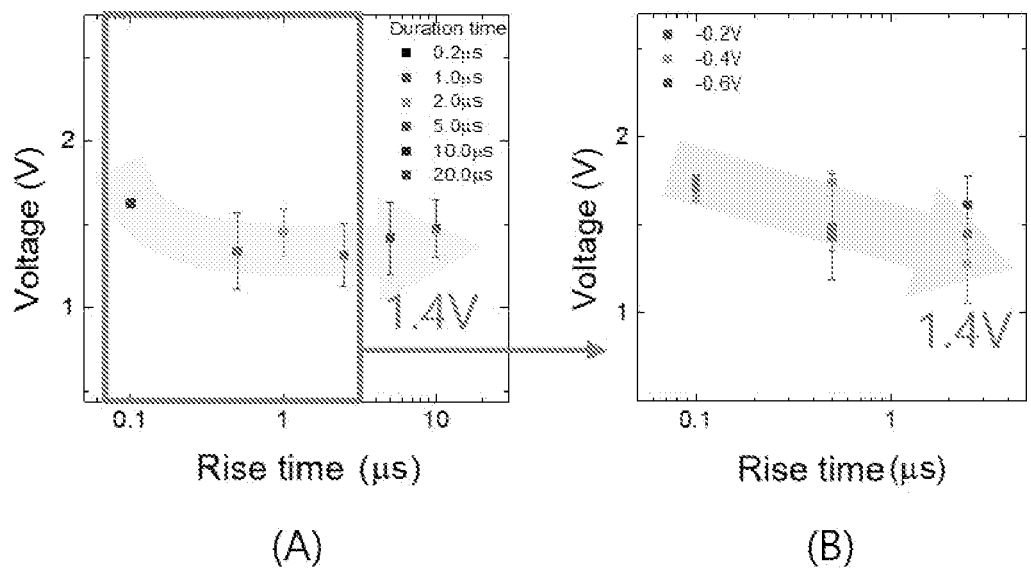
FIG. 11 is a graph showing a change tendency of the threshold voltage $V_{th}$ according to a change in a rise time of a main operating voltage pulse of a voltage signal when the voltage signal described in FIG. 10 is applied to a selector device.

FIG. 11 is a graph showing a change tendency of the threshold voltage $V_{th}$ according to a change in the rise time of the main operating voltage pulse MP of the voltage signal when the voltage signal described in FIG. 10 is applied to a selector device. Graph (A) shows the change tendency of the threshold voltage $V_{th}$ when the voltage of the refresh voltage pulse RP is −0.6 V, and graph (B) shows the change tendency of the threshold voltage $V_{th}$ under various voltage conditions (−0.2 V, −0.4 V, −0.6 V) of the refresh voltage pulse RP. The graph (B) is the result for the rise time region in the graph (A) enclosed in the gray box.

Referring to graph (A) of FIG. 11, it may be seen that the change tendency of the threshold voltage $V_{th}$ is the same as that of the graph (A) of FIG. 9.

Referring to the graph (B) of FIG. 11, it may be seen that even when the voltage of the refresh voltage pulse RP is changed within the given range of the example values, the change tendency of the threshold voltage $V_{th}$ is similar.

Figure 12:
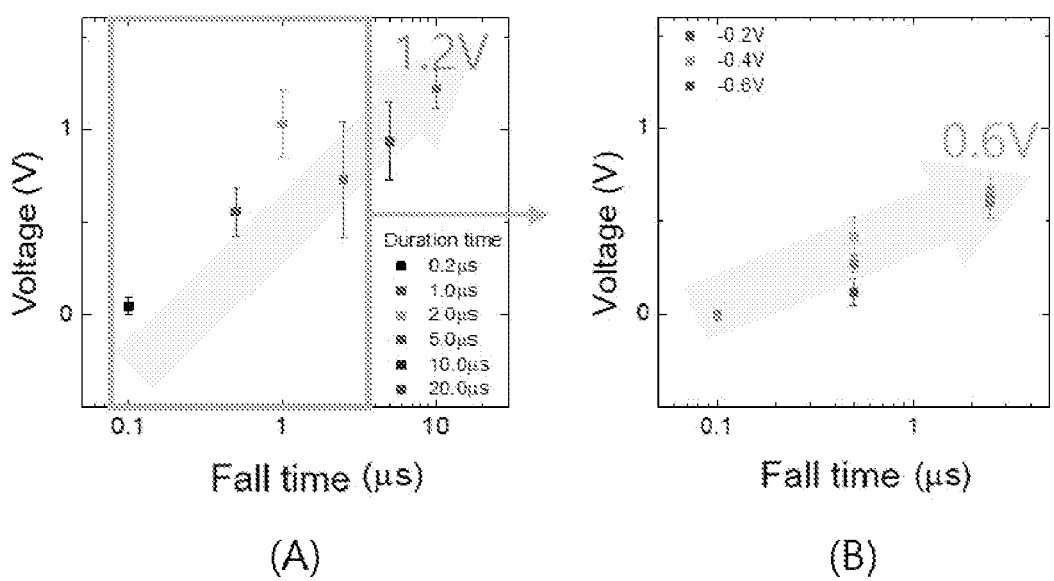
FIG. 12 is a graph showing a change tendency of the hold voltage $V_{hold}$ according to a change in the rise time of a main operating voltage pulse of a voltage signal when the voltage signal described in FIG. 10 is applied to a selector device.

FIG. 12 is a graph showing a change tendency of the hold voltage $V_{hold}$ according to a change in the rise time of a main operating voltage pulse of a voltage signal when the voltage signal described in FIG. 10 is applied to a selector device. The graph (A) shows the change tendency of the hold voltage $V_{hold}$ when the intensity of the refresh voltage pulse RP is −0.6 V, and the graph (B) shows the change tendency of the hold voltage $V_{hold}$ under various intensity conditions (−0.2 V, −0.4 V, −0.6 V) of refresh voltage pulse RP. The graph (B) is the result for the fall time region in graph (A) enclosed in the gray box.

Referring to the graph (A) of FIG. 12, it may be seen that the change tendency of the hold voltage $V_{hold}$ is the same as that of the graph (B) of FIG. 9.

Referring to the graph (B) of FIG. 12, it may be seen that even when the intensity of the refresh voltage pulse RP is changed within the given range of the example values, the change tendency of the hold voltage $V_{hold}$ is similar. Therefore, regardless of the voltage intensity of the refresh voltage pulse RP, characteristics related to the hold voltage $V_{hold}$ may be similarly improved when the refresh voltage pulse RP of the opposite polarity is additionally applied. When the voltage of the refresh voltage pulse RP is set to a size which does not affect the main operation (i.e., turn-on, turn-off) of the selector device, as it has an effect of removing a turn-off suppression factor regardless of the value of the voltage, so that improvement of the characteristics related to the hold voltage $V_{hold}$ may be obtained.

Figure 13:
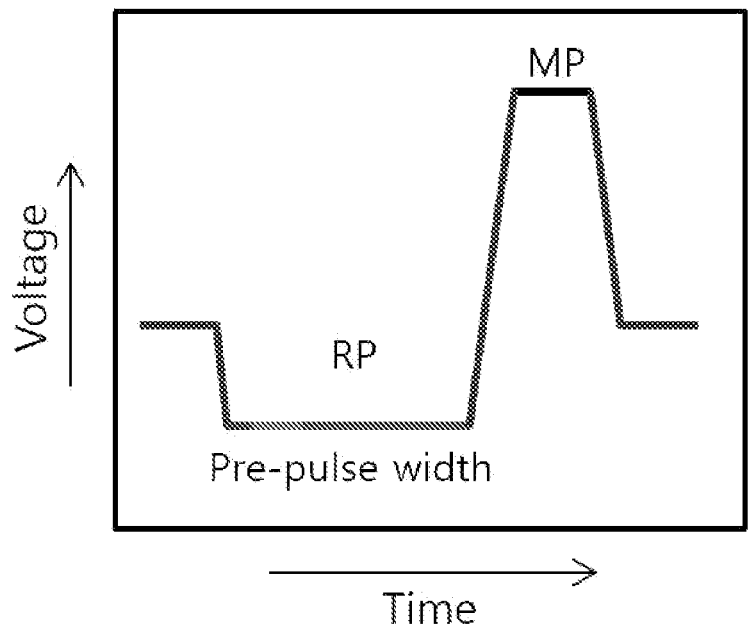
FIG. 13 is a graph showing a case where the duration time of a refresh voltage pulse is variously changed in a voltage signal which may be applied to a technique for operating a selector device according to an embodiment of the present invention.

FIG. 13 is a graph showing a case where the duration time (i.e., a width) of a refresh voltage pulse RP is variously changed in a voltage signal which may be applied to a technique for operating a selector device according to an embodiment of the present invention.

Referring to FIG. 13, a voltage signal applied to the selector device may include a refresh voltage pulse RP and a main operating voltage pulse MP following the refresh voltage pulse RP. Here, the refresh voltage pulse RP may be a pre-refresh voltage pulse. The duration time (i.e., width) of the refresh voltage pulse RP may be changed to, for example, 2 μs, 60 μs, and 200 μs. In this example, the duration time (i.e., width) of the main operating voltage pulse MP was fixed at 20 μs. Accordingly, the ratio (main pulse width:refresh pulse width) of the duration time of the main operating voltage pulse MP to the duration time of the refresh voltage pulse RP was changed to 1:0.1, 1:3, and 1:10.

Figure 14:
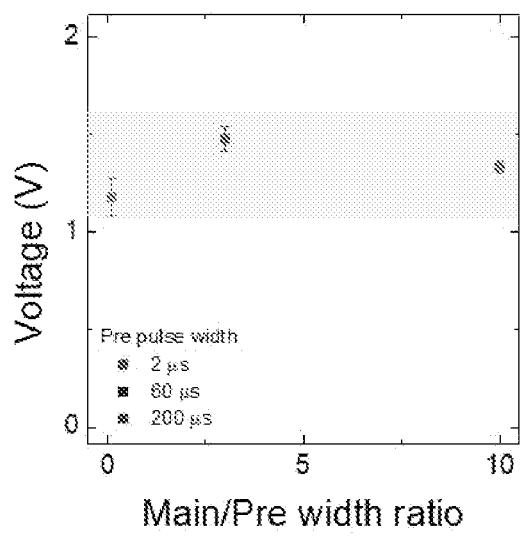
FIG. 14 is a graph showing a change tendency of the threshold voltage $V_{th}$ and a change tendency of the hold voltage $V_{hold}$ according to a ratio of the duration time of the main operating voltage pulse and the duration time of the refresh voltage pulse when a voltage signal as described in FIG. 13 is applied to a selector device.
Figure 14:
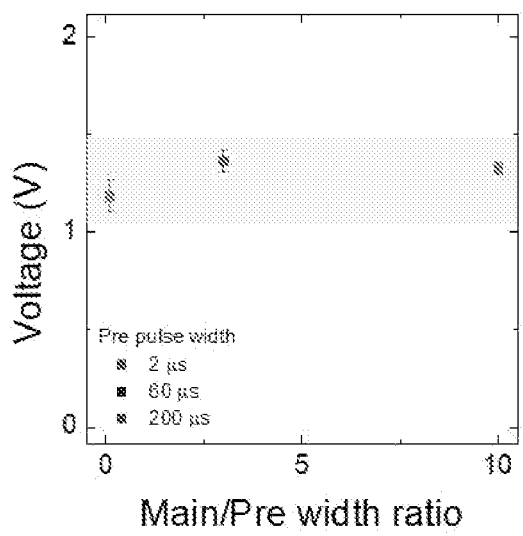

FIG. 14 is a graph showing a change tendency of the threshold voltage $V_{th}$ and a change tendency of the hold voltage $V_{hold}$ according to a ratio of the duration time of the main operating voltage pulse MP to the duration time of the refresh voltage pulse RP when a voltage signal as described in FIG. 13 is applied to a selector device. Graph (A) shows the change tendency of the threshold voltage $V_{th}$, and Graph (B) shows the change tendency of the hold voltage $V_{hold}$. In the illustrated example, the duration time of the main operating voltage pulse MP was 20 μs.

Referring to graph (A) of FIG. 14, it may be confirmed that even if the duration time of the refresh voltage pulse RP is changed within the given range (i.e., 2 μs, 60 μs, and 200 μs), the threshold voltage $V_{th}$ of the selector device has a similar level.

Referring to graph (B) of FIG. 14, it may be confirmed that even if the duration time of the refresh voltage pulse RP is changed within the given range (i.e., 2 μs, 60 μs, and 200 μs), the hold voltage $V_{hold}$ has a similar level.

From the results of FIG. 14, it may be seen that even when the duration time of the refresh voltage pulse RP is changed within the given range, each of the change tendency of the threshold voltage $V_{th}$ and the change tendency of the hold voltage $V_{hold}$ is similar. Regardless of the duration of the refresh voltage pulse RP, when the refresh voltage pulse RP of opposite polarity is additionally applied, a characteristics related to the hold voltage $V_{hold}$ may be similarly improved. The duration of the refresh voltage pulse RP may not significantly affect its effectiveness in removing turn-off suppression factors. Even if the duration time of the refresh voltage pulse RP is set to a level shorter than the duration time of the main operating voltage pulse MP, since the hold voltage $V_{hold}$ is increased by the refresh voltage pulse RP, a symmetrical operating characteristic may be easily achieved.

Figure 15:
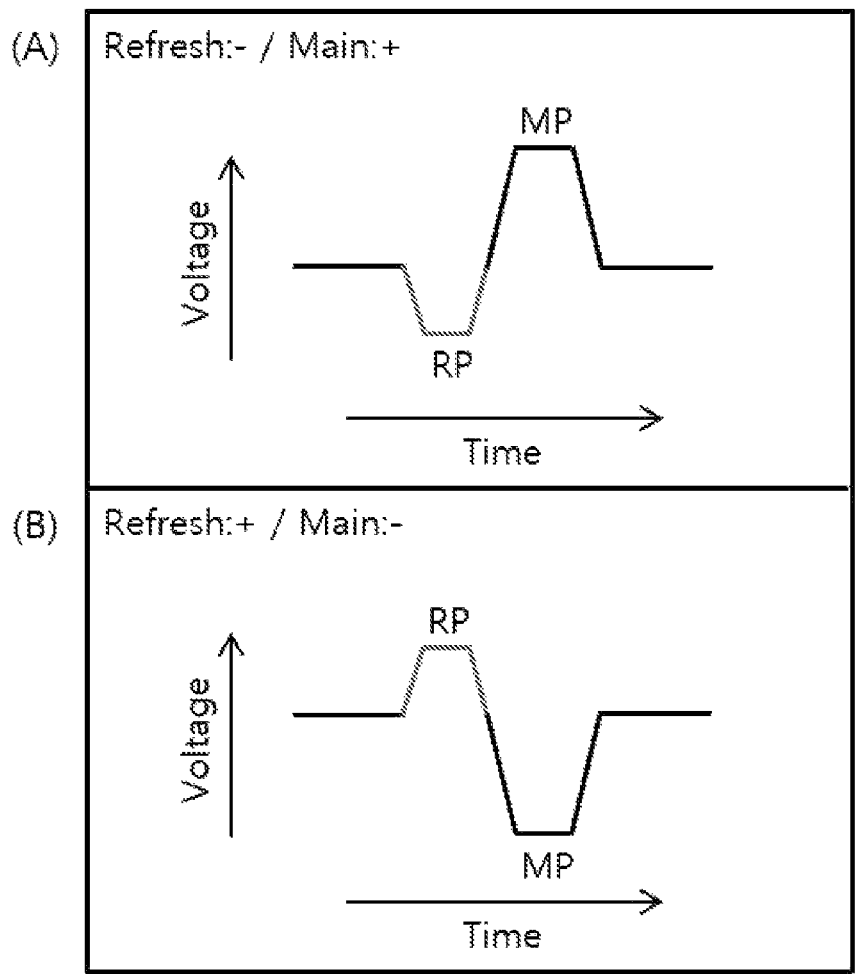
FIG. 15 is a graph showing the polarities which a main operating voltage pulse and a refresh voltage pulse may have in a technique for operating a selector device according to embodiments of the present invention.

FIG. 15 is a graph showing the polarities which a main operating voltage pulse and a refresh voltage pulse may have in a technique for operating a selector device according to embodiments of the present invention. Graph (A) in FIG. 15 is according to the first embodiment, and graph (B) is according to the second embodiment.

Referring to graph (A) of FIG. 15, the main operating voltage pulse MP may be a positive (+) voltage pulse, and in this case, the refresh voltage pulse RP may be a negative (−) voltage pulse.

Referring to graph (B) of FIG. 15, the main operating voltage pulse MP may be a negative (−) voltage pulse, and in this case, the refresh voltage pulse RP may be a positive (+) voltage pulse.

Figure 16:
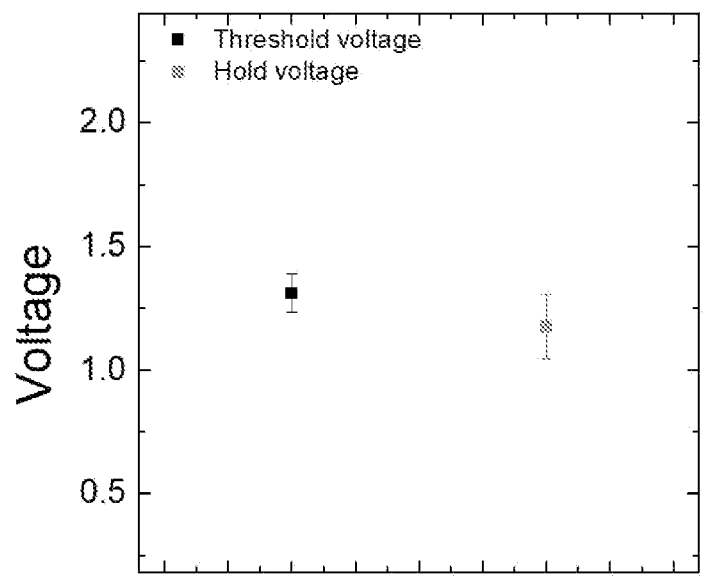
FIG. 16 is a graph showing measured values of a threshold voltage $V_{th}$ and a hold voltage $V_{hold}$ when a voltage signal as described with reference to graph (A) of FIG. 15 is applied to a selector device.

FIG. 16 is a graph showing the measured values of a threshold voltage $V_{th}$ and a hold voltage $V_{hold}$ when a voltage signal as described with reference to graph (A) of FIG. 15 is applied to a selector device. At this time, the duration time of the main operating voltage pulse MP was 20 μs.

Referring to FIG. 16, when the main operating voltage pulse MP has a positive (+) polarity and the refresh voltage pulse RP has a negative (−) polarity, it may be seen that the threshold voltage $V_{th}$ and the hold voltage $V_{hold}$ have similar levels to each other. These results may correspond to those described above with reference to FIGS. 8 and 9.

Figure 17:
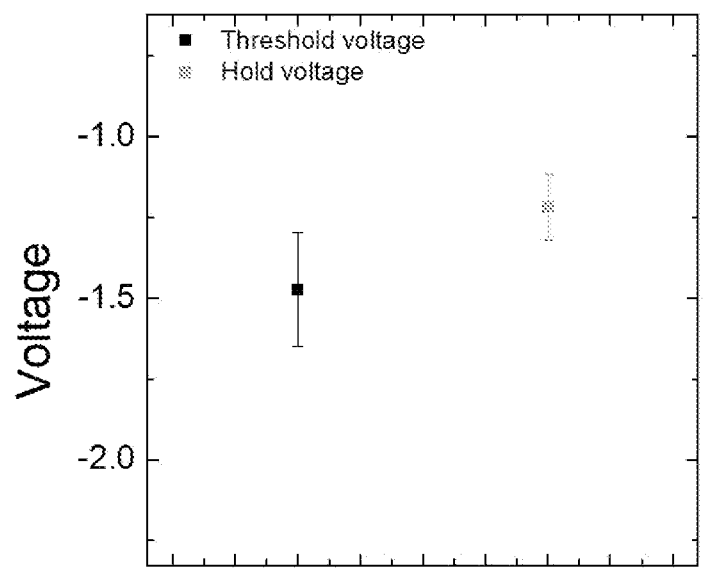
FIG. 17 is a graph showing measured values of a threshold voltage $V_{th}$ and a hold voltage $V_{hold}$ when a voltage signal as described with reference to graph (B) of FIG. 15 is applied to the selector device.

FIG. 17 is a graph showing measured values of a threshold voltage $V_{th}$ and a hold voltage $V_{hold}$ when a voltage signal as described with reference to graph (B) of FIG. 15 is applied to the selector device. At this time, the duration time of the main operating voltage pulse MP was 20 μs.

Referring to FIG. 17, when the main operating voltage pulse MP has a negative (−) polarity and the refresh voltage pulse RP has a positive (+) polarity, it may be seen that the threshold voltage $V_{th}$ and the hold voltage $V_{hold}$ have similar levels to each other. In this case, by applying the refresh voltage pulse RP, the hold voltage $V_{hold}$ may increase in a negative (−) direction to a level similar to that of the threshold voltage $V_{th}$.

From the results of FIG. 16 and FIG. 17, when the refresh voltage pulse RP having a polarity opposite to that of the main operating voltage pulse MP is applied according to an embodiment of the present invention, it may be confirmed that the absolute value of the hold voltage $V_{hold}$ may increase regardless of the polarity of the main operating voltage pulse MP, and accordingly, the effect of reducing the snapback region (section) may be obtained regardless of the polarity of the main operating voltage pulse MP.

Figure 18:
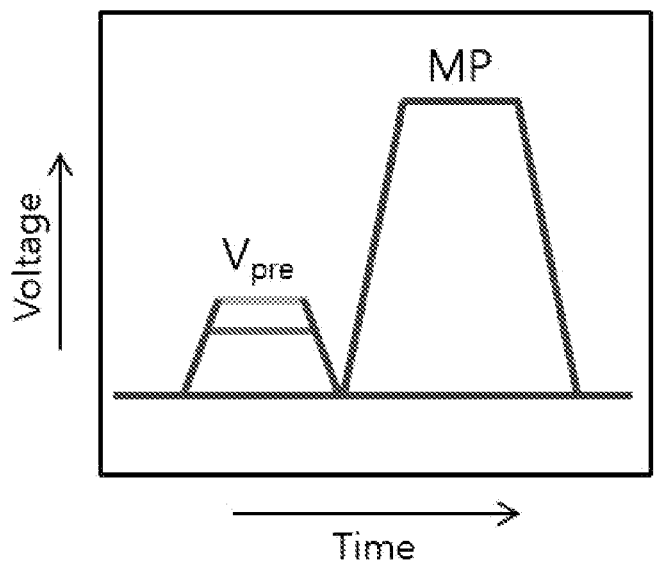
FIG. 18 is a graph showing a waveform of a voltage signal applied to a technique for operating a selector device according to a comparative example.

FIG. 18 is a graph showing a waveform of a voltage signal applied to a technique for operating a selector device according to a comparative example.

Referring to FIG. 18, a voltage signal applied to the technique for operating the selector device according to the comparative example includes a main operating voltage pulse MP and a pre-voltage pulse Vpre preceding the main operating voltage pulse MP, and the main operating voltage pulse MP and the pre-voltage pulse Vpre have the same polarity. Here, the intensity of the pre-voltage pulse Vpre is 1.0 V or 1.2 V.

Figure 19:
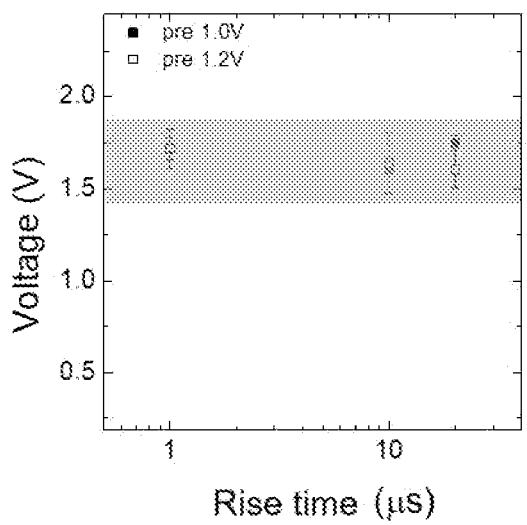
FIG. 19 is a graph showing a change tendency of a threshold voltage $V_{th}$ and a change tendency of a hold voltage $V_{hold}$ according to a change in rise or fall time of a main operating voltage pulse of a voltage signal when the voltage signal according to a comparative example as described in FIG. 18 is applied to a selector device.
Figure 19:
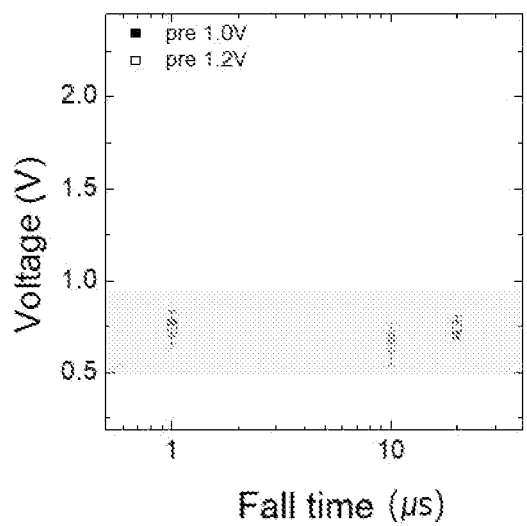

FIG. 19 is a graph showing a change tendency of a threshold voltage $V_{th}$ and a change tendency of a hold voltage $V_{hold}$ according to a change in rise or fall times of a main operating voltage pulse of a voltage signal when the voltage signal according to a comparative example as described in FIG. 18 is applied to a selector device. Graph (A) if FIG. 19 shows the change tendency of the threshold voltage $V_{th}$, and graph (B) shows the change tendency of the hold voltage $V_{hold}$.

When comparing the graphs (A) and (B) of FIG. 19, it may be seen that the difference between the threshold voltage $V_{th}$ and the hold voltage $V_{hold}$ is relatively large. It may be seen that the threshold voltage $V_{th}$ hardly changes even if the rise time of the main operating voltage pulse MP increases, and the hold voltage $V_{hold}$ also hardly changes even if the fall time of the main operating voltage pulse MP increases. Even when the voltage of the pre-voltage pulse Vpre was changed, the result was similar. The results according to this comparative example may be similar to the case of applying only a single pulse. Therefore, as in the comparative example, it may be seen that when the main operating voltage pulse MP and the pre-voltage pulse Vpre have the same polarity, the effect increasing the hold voltage $V_{hold}$ may not be obtained and the effect of reducing the snapback section may not be obtained.

FIG. 18 and FIG. 19 describe a comparative example using a pre-voltage pulse Vpre having the same polarity as the main operating voltage pulse MP, but in other comparative examples using a post-voltage pulse having the same polarity as the main operating voltage pulse MP, the evaluation results may be similar to those described in FIG. 19.

Figure 20:
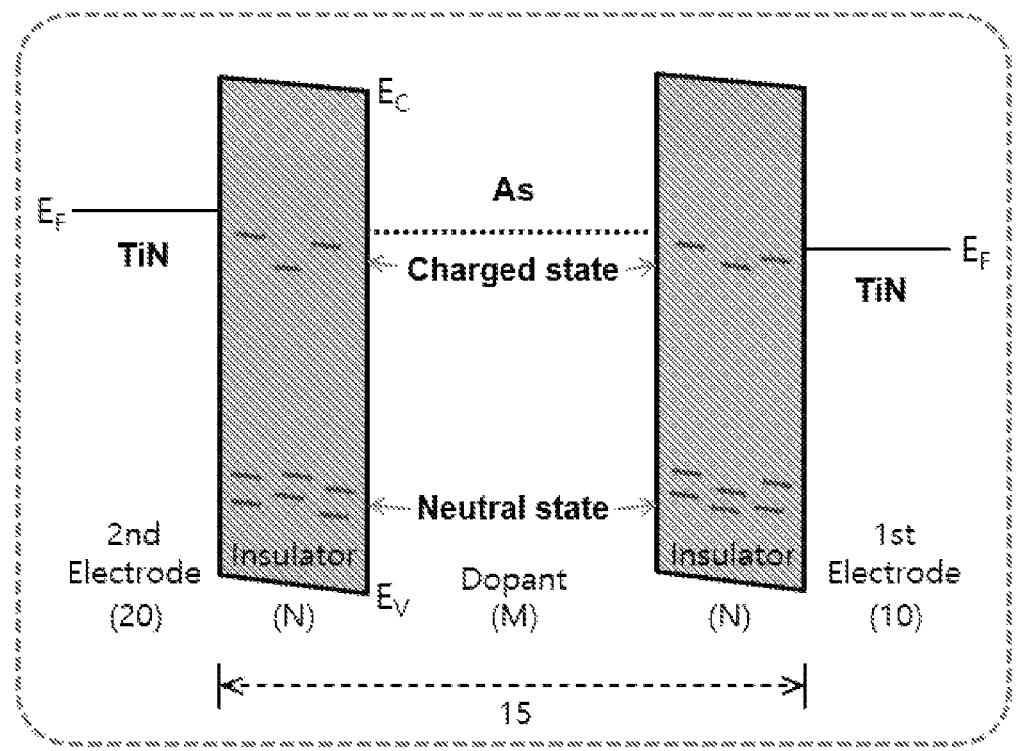
FIG. 20 is an energy band diagram of a selector device when only a main operating voltage pulse having a positive (+) polarity is applied to the selector device according to a comparative example.

FIG. 20 shows an energy band diagram of a selector device according to a comparative example when only a main operating voltage pulse having a positive (+) polarity is applied to the selector device. In FIG. 20, the reference numeral $E_C$ denotes the lowest energy level of the conduction band, $E_V$ denotes the highest energy level of the valence band, and $E_F$ denotes the Fermi energy level. The reference numerals 10, 15, and 20 correspond to the elements described in FIG. 1. Also, reference numeral N denotes an insulator, and M denotes a dopant (metal). The insulator N may be silicon oxide (e.g., $SiO_2$), and the dopant M may be arsenic (As). The band configuration of the switching layer 15 shown in FIG. 20 is illustrative and may be variously changed. These reference numerals and related information are equally applied to FIG. 21.

Referring to FIG. 20, when only the main operating voltage pulse is applied to the selector device, the remaining hole charging dimers which are not removed during the holding process may remain. A hold voltage $V_{hold}$ (about 0.6V) considerably lower than a threshold voltage $V_{th}$ (about 1.2V) may be produced by these remaining hole charging dimers. In the threshold switching process, due to overcharge generated at the unstable $SiO_2$/charged state/As interface, the fixed charges are temporarily generated at the interface and a dipole may be formed. Even if the intensity of the main operating voltage pulse decreases, a band alignment is maintained due to the internal dipole, and a hold occurs at a lower voltage. Since charges remain in deep traps of the insulator N, turn-off becomes difficult due to these remaining charges, and the hold voltage $V_{hold}$ may be lowered.

Figure 21:
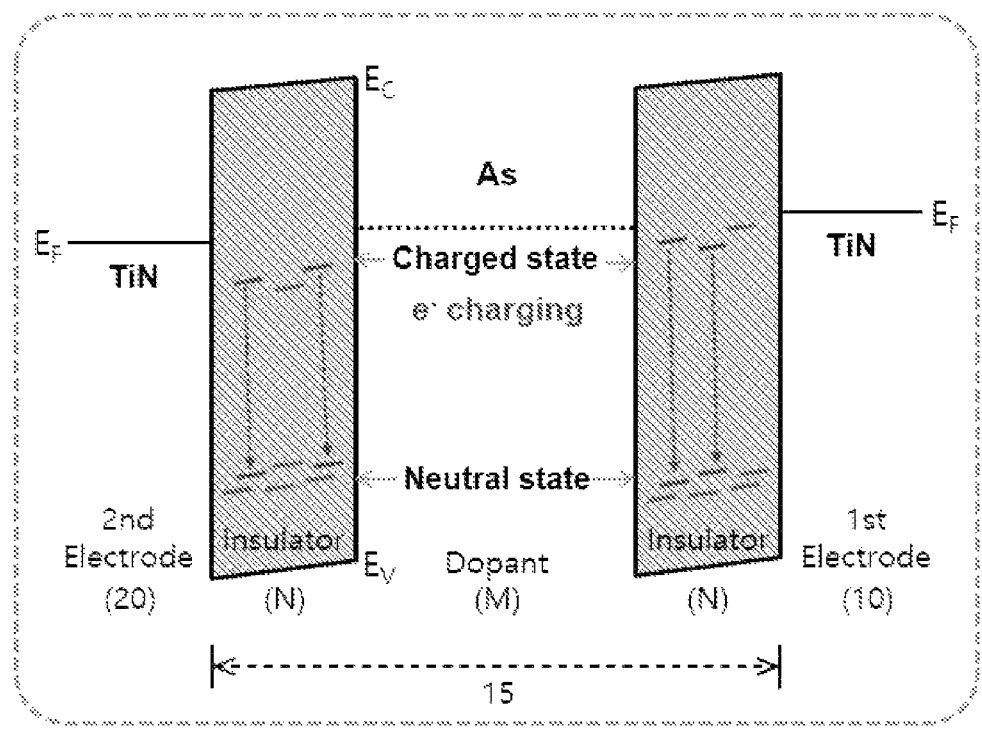
FIG. 21 is a diagram illustrating an energy band diagram of a selector device when a voltage signal including a main operating voltage pulse and a refresh voltage pulse having a polarity opposite to the main operating voltage pulse are applied to the selector device according to an embodiment of the present invention.

FIG. 21 is an energy band diagram of a selector device when a voltage signal including a main operating voltage pulse and a refresh voltage pulse having a polarity opposite to the main operating voltage pulse are applied to the selector device according to an embodiment of the present invention.

Referring to FIG. 21, when a refresh voltage pulse is applied, e charging may occur on remaining hole charging dimers which are not completely removed during a hold process of the main operating voltage pulse preceding the refresh voltage pulse. Accordingly, the remaining positive charged dimers may be converted into neutral dimers, and the degree of overcharging may be reduced when the next main operating voltage pulse is applied. Accordingly, the hold voltage $V_{hold}$ may increase (for example, to about 1.2V) and the snapback region may decrease due to the decrease in generation of dipoles due to overcharging. In other words, charges remaining in deep traps of the insulator N may be converted into a neutral state by a refresh voltage pulse of opposite polarity, and as a result, turn-off becomes easier and thus, the hold voltage $V_{hold}$ may increase.

Although the material combination of $SiO_2$ and As has been described in FIG. 21, this is only illustrative, and various material combinations may be applied in consideration of a band gap between the insulator matrix and the dopant. In connection with the material configuration of the insulator matrix and the dopant, the explanation which are previously described may be referred to.

Figure 22:
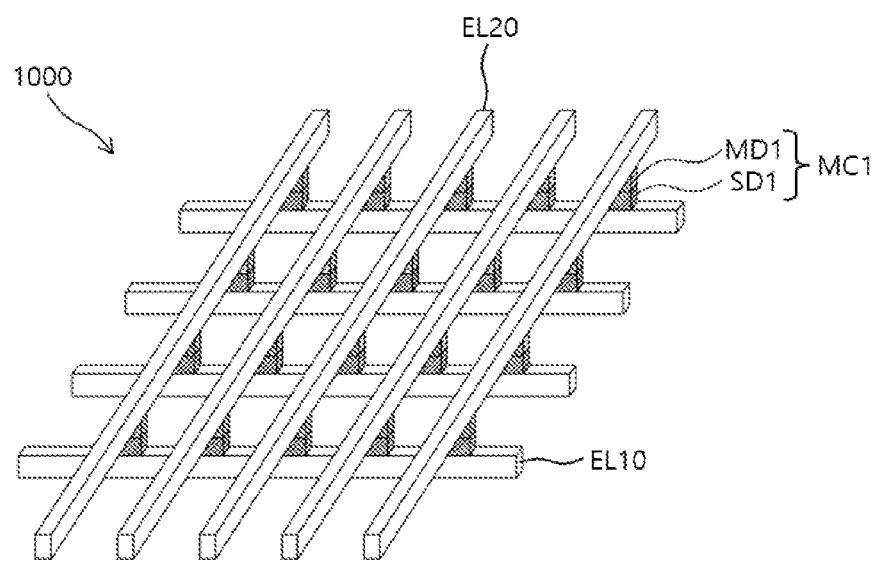
FIG. 22 is a perspective view for explaining a nonvolatile memory apparatus and an operating technique thereof according to an embodiment of the present invention.

FIG. 22 is a perspective view for explaining a nonvolatile memory apparatus and an operating technique thereof according to an embodiment of the present invention.

Referring to FIG. 22, a nonvolatile memory apparatus according to an embodiment of the present invention may include a memory device 1000. The memory device 1000 may have a crossbar memory array structure. The memory device 1000 may include a plurality of first electrode lines EL10 extending in a first direction, a plurality of second electrode lines EL20 extending in a second direction, spaced apart from the plurality of first electrode lines EL10 and crossing the first direction, and a plurality of memory cells MC1 disposed at intersections between the plurality of first electrode lines EL10 and the plurality of second electrode lines EL20. In one embodiment, the plurality of second electrode lines EL20 may extend to perpendicularly cross the plurality of first electrode lines EL10. One of the first electrode line EL10 and the second electrode line EL20 may be referred to as a word line, and the other may be referred to as a bit line. In addition, both the first electrode line EL10 and the second electrode line EL20 may be referred to as wiring.

Each of the plurality of memory cells MC1 may include a memory element MD1 having a nonvolatile property and a selector device SD1 serially connected to the memory element MD1. The memory element MD1 may include a type of variable resistor. Therefore, it may be said that the memory cell MC1 has a one-selector-one-resistor (1S1R) structure. Here, the selector device SD1 may correspond to the selector device SD10 described in FIG. 1 and the like. A lower electrode (first electrode) of the selector device SD1 may be connected to the first electrode line EL10, and in some cases, at least a part of the lower electrode (first electrode) may be replaced with the first electrode line EL10. The memory element MD1 may include a memory layer, and an upper electrode (second electrode) of the selector device SD1 may be disposed between the memory layer and the switching layer of the selector device SD1. In this case, the upper electrode (second electrode) of the selector device SD1 may be a kind of intermediate electrode or may be a floating electrode. The memory layer (i.e., a variable resistor layer) of the memory element MD1 may include, for example, any one selected from the group consisting of a resistance change memory layer, a phase change memory layer, a magnetic memory layer, and the like. All memory materials which may be applied to crossbar-type memory devices may be applied to the memory element MD1. The nonvolatile memory apparatus according to the present embodiment may be ReRAM, PCRAM, MRAM, or other types of RAM. The MRAM may be a standard-connection (SC) MRAM or other types of MRAM.

The configuration of the memory device 1000 shown in FIG. 22 is illustrative and may be variously changed. For example, the memory cell MC1 may have a cylindrical shape, and the positions of the memory element MD1 and the selector device SD1 may be reversed. In addition, after disposing a plurality of third electrodes (not shown) on the plurality of second electrodes EL20 to cross the plurality of second electrodes EL20, a plurality of second memory cells (not shown) may be disposed at intersections between the plurality of second electrodes EL20 and the plurality of third electrodes. The second memory cell may have the same structure as the memory cell MC1 or may have an inverse structure (upside down structure) of the memory cell MC1. In addition, the configuration of the memory device 1000 may be variously changed.

In another embodiment, the selector device SD1 may be a steering element of a memristor, and may simultaneously implement memory and calculation functions, and may mimic the role of a synapse in the brain. For example, when configuring a synapse which is a connection between a pre-neuron and a post-neuron in a circuit manner, a selector device according to an embodiment of the present invention, and a memristor as a variable resistor connected in series thereto may be implemented. The pre-neuron may input a pre-spike signal into a synapse, and the synapse may transmit a predetermined synaptic signal to a post-neuron, and the post-neuron may generate a post-spike signal.

Similar to the manner in which the synapse connects a pre-neuron and a post-neuron, the memristor device may play a role to connect a pre-synaptic neuron circuit and a post-synaptic neuron circuit. A plurality of memristor elements may be arranged to form a plurality of columns and a plurality of rows. A plurality of first wires EL10 may be arranged, a plurality of second wires EL20 crossing them may be arranged, and the memristor element may be arranged at an intersection of the first wires EL10 and the second wires EL20. A plurality of first wires EL10 may be connected to the second electrode of the memristor element, and a plurality of second wires EL20 may be connected to the first electrode of the memristor element. The first wiring EL10 may be connected to a pre-synaptic neuron circuit, and the second wiring EL20 may be connected to a post-synaptic neuron circuit.

The selector device SD1 included in FIG. 22 may be operated according to the operation technique for the selector device according to the embodiments described with reference to FIGS. 1 to 9. Accordingly, the technological details described with reference to FIGS. 1, 2, 6 to 17, and 21 may also be applied to the selector device SD1 of FIG. 22.

Figure 23:
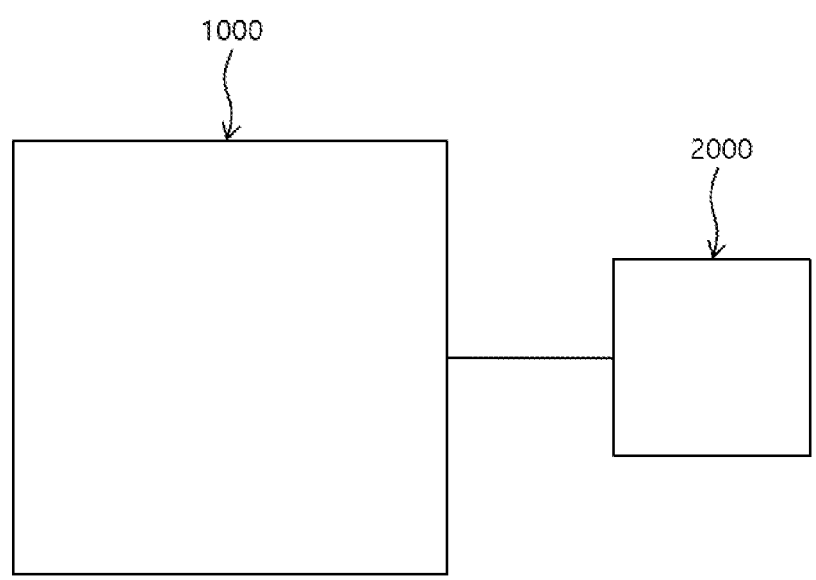
FIG. 23 is a block diagram for explaining a nonvolatile memory apparatus according to an illustrative embodiment of the present invention.

FIG. 23 is a block diagram for explaining a nonvolatile memory apparatus according to an illustrative embodiment of the present invention.

Referring to FIG. 23, a nonvolatile memory apparatus according to an embodiment may include a memory device 1000 and a memory control circuit 2000 electrically connected thereto. The memory device 1000 may correspond to the memory device 1000 described with reference to FIG. 22. The memory control circuit 2000 is a member for controlling the operation of the memory device 1000 and may include a driving circuit portion for driving a selector device included in the memory device 1000. The driving circuit portion may correspond to the driving circuit portion 200 described in FIG. 1. Accordingly, the selector device included in the memory device 1000 and the driving circuit portion included in the memory control circuit 2000 may constitute the electronic circuit device described with reference to FIG. 1 and the like.

According to the embodiments of the present invention described above, an operation technique for a selector device capable of effectively suppressing or preventing the snapback phenomenon of the selector device by using a software-like method (i.e., a method controlling the driving conditions) rather than a hardware method may be implemented. Therefore, the snapback phenomenon may be effectively suppressed or prevented without adjusting a composition, a thickness, a size or the like of the selector device and without connecting the selector to a separate external resistor, and the operating characteristics of the selector device may be appropriately controlled as needed. According to embodiments of the present invention, as the snapback phenomenon is suppressed or prevented, a nonvolatile memory apparatus having excellent memory characteristics, a small cell size, and a high degree of integration may be implemented. In particular, the technology according to the embodiment may be usefully applied to a crossbar memory array device having a 1S1R structure.

In the present specification, the preferred embodiments of the present invention have been disclosed, and although specific terms are used, these are only used in a general sense to easily describe the technological contents of the present invention and to help the understanding of the present invention, and are not used to limit the scope of the present invention. It will be apparent to those of ordinary skill in the art to which the present invention pertains that other modifications based on the technological spirit of the present invention may be implemented in addition to the embodiments disclosed herein. It will be appreciated to those of ordinary skill in the art that a technique for operating a selector device, a technique for operating a nonvolatile memory apparatus to which the same is applied, an electronic circuit device including selector device and nonvolatile memory apparatus according to the embodiment described with reference to FIGS. 1, 2, 6 to 17, and 21 to 23 may be variously substituted, changed and modified without departing from the spirit of the present invention. Therefore, the scope of the invention should not be determined by the described embodiments, but should be determined by the technological concepts described in the claims.

EXPLANATION OF SYMBOLS

| * Explanation of symbols for the main parts of the drawing * | |
|---|---|
| 10: first electrode | 15: switching layer |
| 20: second electrode | 100: selector device |
| 200: driving circuit portion | 1000: memory device |
| 2000: memory control circuit | EL10: first electrode line |
| EL20: second electrode line | MC1: memory cell |
| MD1: memory element | MP: main operating voltage pulse |
| RP: refresh voltage pulse | SD1: selector device |

What is claimed is:

1. A method of operating a selector device of a memory element, comprising:
   applying a main operating voltage pulse to a switching layer of the selector device through first and second electrodes of the selector device, a magnitude of a voltage of the main operating voltage pulse being greater than or equal to a magnitude of a threshold voltage for turning on the selector device; and
   applying a refresh voltage pulse having a polarity opposite to that of the main operating voltage pulse to the switching layer through the first and second electrodes, a maximum magnitude of a voltage of the refresh voltage pulse being less than the magnitude of the threshold voltage.

2. The method of operating a selector device of claim 1, wherein a difference between the threshold voltage at which the selector device is turned on and a hold voltage at which the selector device is turned off is reduced by the application of the refresh voltage pulse.

3. The method of operating a selector device of claim 1, wherein the switching layer comprises an insulator matrix and a non-insulating material disposed within the insulator matrix.

4. The method of operating a selector device of claim 3, wherein the non-insulating material includes a nanocluster, and the nanocluster includes at least one of a metal element and a semiconductor element.

5. The method of operating a selector device of claim 3, wherein the insulator matrix includes at least one selected from a group consisting of silicon oxide, magnesium oxide, aluminum oxide, titanium oxide, chromium oxide, nickel oxide, copper oxide, zinc oxide, yttrium oxide, niobium oxide, lanthanum oxide, hafnium oxide, tantalum oxide, tungsten oxide, zirconium oxide, manganese oxide, iron oxide, antimony oxide, silicon nitride, and aluminum nitride.

6. The method of operating a selector device of claim 3, wherein the non-insulating material includes at least one selected from a group consisting of arsenic (As), phosphorus (P), antimony (Sb), bismuth (Bi), silicon (Si), germanium (Ge), tin (Sn), lead (Pb), aluminum (Al), gallium (Ga), indium (In), silver (Ag), gold (Au), palladium (Pd), platinum (Pt), iridium (Ir), ruthenium (Ru), molybdenum (Mo), tungsten (W), tantalum (Ta), titanium (Ti), zirconium (Zr), hafnium (Hf), magnesium (Mg), calcium (Ca), lithium (Li), sodium (Na), lanthanum (La), niobium (Nb), vanadium (V), chromium (Cr), and copper (Cu).

7. The method of operating a selector device of claim 1, wherein the refresh voltage pulse is applied immediately after applying the main operating voltage pulse.

8. The method of operating a selector device of claim 1, wherein the refresh voltage pulse is applied immediately before applying the main operating voltage pulse.

9. The method of operating a selector device of claim 1, wherein a plurality of main operating voltage pulses are applied to the switching layer, and the refresh voltage pulse is applied between each pair of adjacent main operating voltage pulses in the plurality of main operating voltage pulses.

10. The method of operating a selector device of claim 1, wherein the maximum magnitude of the voltage of the refresh voltage pulse is between 0.1 V and 1.0 V.

11. The method of operating a selector device of claim 1, wherein a duration of the refresh voltage pulse is between 0.1 microseconds and 10 milliseconds.

12. The method of operating a selector device of claim 1, wherein the magnitude of the voltage of the main operating voltage pulse is between 0.5 V and 5 V, and a duration of the main operating voltage pulse is between 10 nanoseconds and 100 microseconds.

13. A method of operating a nonvolatile memory apparatus, the nonvolatile memory apparatus comprising a plurality of memory cells arranged at intersections between a plurality of first electrode lines and a plurality of second electrode lines, each of the plurality of memory cells including a memory element having a nonvolatile property and a selector device connected in series with the memory element,
wherein the method of operating a nonvolatile memory apparatus includes the method of operating a selector device according to claim 1.

14. An electronic circuit device comprising:
a first electrode;
a second electrode;
a memory element;
a selector device including a switching layer for controlling access of a signal to the memory element; and
a driving circuit configured to:
apply a main operating voltage pulse to the selector device through the first and second electrodes, a magnitude of a voltage of the main operating voltage pulse being greater than or equal to a magnitude of a threshold voltage for turning on the selector device, and
apply a refresh voltage pulse having a polarity opposite to that of the main operating voltage pulse to the selector device through the first and second electrodes, a maximum magnitude of a voltage of the refresh voltage pulse being less than the magnitude of the threshold voltage.

15. The electronic circuit device of claim 14, wherein a difference between the threshold voltage and a hold voltage at which the selector device is turned off is reduced by the application of the refresh voltage pulse.

16. The electronic circuit device of claim 14, wherein the switching layer comprises an insulator matrix and a non-insulating material disposed within the insulator matrix.

17. The electronic circuit device of claim 16, wherein the non-insulating material includes a nanocluster, and the nanocluster includes at least one of a metal element and a semiconductor element.

18. The electronic circuit device of claim 16, wherein the insulator matrix includes at least one selected from a group consisting of silicon oxide, magnesium oxide, aluminum oxide, titanium oxide, chromium oxide, nickel oxide, copper oxide, zinc oxide, yttrium oxide, niobium oxide, lanthanum oxide, hafnium oxide, tantalum oxide, tungsten oxide, zirconium oxide, manganese oxide, iron oxide, antimony oxide, silicon nitride, and aluminum nitride.

19. The electronic circuit device of claim 16, wherein the non-insulating material includes at least one selected from a group consisting of arsenic (As), phosphorus (P), antimony (Sb), bismuth (Bi), silicon (Si), germanium (Ge), tin (Sn), lead (Pb), aluminum (Al), gallium (Ga), indium (In), silver (Ag), gold (Au), palladium (Pd), platinum (Pt), iridium (Ir), ruthenium (Ru), molybdenum (Mo), tungsten (W), tantalum (Ta), titanium (Ti), zirconium (Zr), hafnium (Hf), magnesium (Mg), calcium (Ca), lithium (Li), sodium (Na), lanthanum (La), niobium (Nb), vanadium (V), chromium (Cr), and copper (Cu).

20. The electronic circuit device of claim 14, wherein the refresh voltage pulse is immediately applied after applying the main operating voltage pulse.

21. The electronic circuit device of claim 14, wherein the refresh voltage pulse is applied immediately before applying the main operating voltage pulse.

22. The electronic circuit device of claim 14, wherein a plurality of main operating voltage pulses are applied to the switching layer, and the refresh voltage pulse is applied between each pair of adjacent main operating voltage pulses in the plurality of main operating voltage pulses.

23. The electronic circuit device of claim 14, wherein the maximum magnitude of the voltage of the refresh voltage pulse is between 0.1 V and 1.0 V.

24. The electronic circuit device of claim 14, wherein a duration of the refresh voltage pulse is between 0.1 microseconds and 10 milliseconds.

25. The electronic circuit device of claim 14, wherein the magnitude of the voltage of the main operating voltage pulse is between 0.5 V to 5 V, and a duration of the main operating voltage pulse is between 10 nanoseconds and 100 microseconds.

26. A nonvolatile memory apparatus comprising:
a memory device including a plurality of first electrode lines, a plurality of second electrode lines, and a plurality of memory cells arranged at intersections between the plurality of first electrode lines and the plurality of second electrode lines, each of the plurality of memory cells including a memory element having a nonvolatile property and a selector device connected in series with the memory element; and
a memory control circuit for controlling an operation of the memory device, the memory control circuit including a driving circuit for driving the selector device,
wherein the selector device and the driving circuit constitute the electronic circuit device according to claim 14.

* * * * *